(12) United States Patent
Yasue et al.

(10) Patent No.: US 6,401,227 B1
(45) Date of Patent: Jun. 4, 2002

(54) TIMING FAULT DIAGNOSIS METHOD AND APPARATUS

(75) Inventors: Yoshihiro Yasue; Kazuhiro Emi, both of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/182,428

(22) Filed: Oct. 30, 1998

(30) Foreign Application Priority Data

Nov. 13, 1997 (JP) ............................................. 9-312042

(51) Int. Cl.$^7$ .......................... G01R 31/28; G06F 11/00
(52) U.S. Cl. ........................................ 714/744; 714/731
(58) Field of Search ........................... 714/25, 731, 744, 714/726, 724, 741, 738; 11/724, 741, 738

(56) References Cited

U.S. PATENT DOCUMENTS

| | | | | |
|---|---|---|---|---|
| 5,012,471 A | * | 4/1991 | Powell et al. ................ | 714/744 |
| 5,260,949 A | * | 11/1993 | Hashizume et al. ......... | 714/731 |
| 5,365,528 A | * | 11/1994 | Agrawal ...................... | 714/736 |
| 5,502,729 A | * | 3/1996 | Nakata ........................ | 714/728 |
| 5,502,731 A | * | 3/1996 | Meltzer ....................... | 714/726 |
| 5,544,173 A | * | 8/1996 | Meltzer ....................... | 714/726 |
| 5,546,408 A | * | 8/1996 | Keller ......................... | 714/741 |
| 5,640,402 A | * | 6/1997 | Motika et al. ............... | 714/731 |
| 5,642,362 A | * | 6/1997 | Savir .......................... | 714/726 |
| 5,812,561 A | * | 9/1998 | Giles et al. .................. | 714/726 |
| 5,931,963 A | * | 8/1999 | Tasni .......................... | 714/741 |
| 6,073,265 A | * | 6/2000 | Komoda ...................... | 714/738 |
| 6,105,156 A | * | 8/2000 | Yamauchi .................... | 714/738 |
| 6,131,181 A | * | 10/2000 | Bushnell et al. ............. | 716/4 |

OTHER PUBLICATIONS

'Testing Strategy for Cmos Open Fault', IBM Technical Disclosure Bulletin, Jul. 1990, US, vol. No.: 33, Issue No.: 2, p. No.: 356–363.*

* cited by examiner

*Primary Examiner*—Albert Decady
*Assistant Examiner*—Joseph D. Torres
(74) *Attorney, Agent, or Firm*—Staas & Halsey LLP

(57) ABSTRACT

A timing fault diagnosis method diagnoses a timing fault of an integrated circuit chip having a logic circuit formed therein. The timing fault diagnosis method includes steps of (a) obtaining fail information by applying a test pattern to an external input terminal of the integrated circuit chip, (b) extracting, from the logic circuit, a circuit which is to be subjected to a timing fault diagnosis, based on logic structure data of the logic circuit and the fail information, (c) creating a timing fault pattern by assuming a timing fault in each of elements having a possibility of generating a timing fault within the circuit which is to be subjected to the timing fault diagnosis, and (d) specifying an element which is assumed to generate the timing fault based on a timing fault diagnosis by comparing the timing fault pattern and the fail information.

18 Claims, 25 Drawing Sheets

| | DATA1 | CLK1 | CLR1 | DATA2 | CLK2 | CLR2 |
|---|---|---|---|---|---|---|
| P0 | 0 | 0 | P | 0 | 0 | P |
| P1 | 1 | P | 0 | 1 | P | 0 |
| P2 | 1 | P | 0 | 0 | P | 0 |
| P3 | 0 | P | 0 | 0 | P | 0 |
| P4 | 1 | P | 0 | 1 | P | 0 |
| P5 | 0 | P | 0 | 1 | P | 0 |
| P6 | 0 | P | 0 | 0 | P | 0 |

TIME ↓

FIG. 10

| | OUT1 | OUT2 | OUT3 | OUT4 | OUT5 |
|---|---|---|---|---|---|
| P0 | 0 | 1 | 0 | 0 | 1 |
| P1 | 1 | 1 | 0 | 0 | 0 |
| P2 | 1 | 0 | 0 | 1 | 1 |
| P3 | 0 | 0 | 1 | 1 | 1 |
| P4 | 1 | 1 | 1 | 0 | 0 |
| P5 | 0 | 0 | 0 | 1 | 0 |
| P6 | 0 | 1 | 1 | 0 | 1 |

TIME ↓

FIG. 11

| | OUT1 | OUT2 | OUT3 | OUT4 | OUT5 |
|---|---|---|---|---|---|
| P0 | — | — | — | — | — |
| P1 | — | — | — | — | — |
| P2 | — | E | — | E | — |
| P3 | — | — | E | — | — |
| P4 | — | — | — | — | — |
| P5 | — | — | — | E | — |
| P6 | — | E | — | E | — |

TIME ↓

FIG. 14

| | OUT1 | OUT2 | OUT3 | OUT4 |
|---|---|---|---|---|
| P1 | X | — | — | — |
| P2 | — | X | — | X |
| P3 | X | — | X | — |
| P4 | X | X | — | X |
| P5 | X | X | X | X |
| P6 | — | X | X | X |

TIME ↓

FIG. 15

| | OUT1 | OUT2 | OUT3 | OUT4 |
|---|---|---|---|---|
| P1 | — | — | — | — |
| P2 | — | X | — | — |
| P3 | — | — | X | — |
| P4 | — | X | — | — |
| P5 | — | X | X | — |
| P6 | — | X | X | — |

TIME ↓

FIG. 16

TIME ↓

|    | OUT1 | OUT2 | OUT3 | OUT4 |
|----|------|------|------|------|
| P1 | —    | —    | —    | —    |
| P2 | —    | —    | —    | —    |
| P3 | —    | —    | X    | —    |
| P4 | —    | —    | —    | —    |
| P5 | —    | —    | X    | —    |
| P6 | —    | —    | X    | —    |

FIG. 17

TIME ↓

|    | OUT1 | OUT2 | OUT3 | OUT4 |
|----|------|------|------|------|
| P1 | —    | —    | —    | —    |
| P2 | —    | —    | —    | X    |
| P3 | —    | —    | —    | —    |
| P4 | —    | —    | —    | X    |
| P5 | —    | —    | —    | X    |
| P6 | —    | —    | —    | X    |

FIG. 18

| | DATA1 | CLK1 | CLR1 | DATA2 | CLK2 | CLR2 |
|---|---|---|---|---|---|---|
| P0 | 0 | 0 | 0 | 0 | 0 | 0 |
| P1 | 1 | P | 0 | 1 | P | 0 |
| P2 | 1 | P | 0 | 0 | P | 0 |
| P3 | 0 | P | 0 | 0 | P | 0 |
| P4 | 1 | P | 0 | 1 | P | 0 |
| P5 | 0 | P | 0 | 1 | P | 0 |
| P6 | 0 | P | 0 | 0 | P | 0 |

TIME ↓

FIG. 22

TIME ↓

| | FF49.Q | FF50.Q | X51 | X52 |
|---|---|---|---|---|
| P1 | X | — | X | — |
| P2 | — | X | X | — |
| P3 | — | — | — | — |
| P4 | X | — | — | — |
| P5 | X | X | X | X |
| P6 | — | X | — | — |
| P7 | X | — | X | — |

| | FF49.Q | FF50.Q | X51 | X52 |
|---|---|---|---|---|
| P1 | — | — | — | — |
| P2 | — | X | X | X |
| P3 | — | — | — | — |
| P4 | — | — | — | — |
| P5 | — | X | X | — |
| P6 | — | X | — | X |
| P7 | — | — | — | — |

TIME ↓

FIG. 26

| | TEST PATTERN | | ANTICIPATED VALUE | | |
|---|---|---|---|---|---|
| | DATA1 | CLK1 | OUT1 | OUT2 | OUT3 |
| P0 | 0 | 0 | X | X | X |
| P1 | 1 | P | 1 | 1 | 1 |
| P2 | 0 | P | 0 | 0 | 0 |
| P3 | 0 | P | 0 | 0 | 0 |
| P4 | 1 | P | 1 | 1 | 1 |
| P5 | 0 | P | 0 | 0 | 0 |
| P6 | 1 | P | 1 | 1 | 1 |

TIME ↓

FIG. 27

| | OUT1 | OUT2 | OUT3 |
|---|---|---|---|
| P0 | — | — | — |
| P1 | — | — | — |
| P2 | E | E | — |
| P3 | — | — | — |
| P4 | — | — | — |
| P5 | — | — | — |
| P6 | E | — | — |

TIME ↓

FIG. 30

| | TEST PATTERN | | | | | ANTICIPATED VALUE | | FAIL INFO | |
|---|---|---|---|---|---|---|---|---|---|
| | D1 | D2 | D3 | CLK | CLR | Q1 | Q2 | Q1 | Q2 |
| P1 | 0 | 0 | 0 | 0 | P | 0 | 0 | — | — |
| P2 | 0 | 0 | 1 | P | 0 | 1 | 0 | E | — |
| P3 | 1 | 0 | 1 | P | 0 | 1 | 1 | — | E |
| P4 | 1 | 0 | 0 | P | 0 | 0 | 1 | — | — |
| P5 | 1 | 1 | 0 | P | 0 | 1 | 1 | — | — |
| P6 | 1 | 1 | 1 | P | 0 | 1 | 1 | — | — |
| P7 | 0 | 1 | 1 | P | 0 | 1 | 0 | — | — |
| P8 | 0 | 0 | 1 | P | 0 | 1 | 0 | — | — |
| P9 | 0 | 0 | 0 | P | 0 | 0 | 0 | — | — |

TIME →

TIMING FAULT DIAGNOSIS METHOD AND APPARATUS

BACKGROUND OF THE INVENTION

The present invention generally relates to timing fault diagnostic methods and apparatuses, and more particularly to a timing fault diagnostic method and apparatus for diagnosing a timing fault of an integrated circuit chip in which a logic circuit is formed.

As the integration density of the integrated circuit increases, required restrictions may be satisfied on a timing simulator or a static timing analyzing tool, but a timing fault may be generated on the actual integrated circuit chip.

When the timing error is generated in a flip-flop circuit, RAM or the like formed in the integrated circuit chip and an erroneous logic value is stored in a memory element, this erroneous stored value propagates to elements provided in subsequent stages, thereby causing an erroneous operation of the integrated circuit chip as a whole.

Accordingly, there are demands to realize a timing fault diagnostic method and apparatus which can easily detect an element which generates the timing fault, quickly analyze the timing fault, reduce the time required to design the integrated circuit, and reduce the cost involved in designing the integrated circuit.

Conventionally, methods of diagnosing faults of integrated circuit chips in which the logic circuit is formed include diagnosing the stuck fault or short (bridging) fault, and diagnosing the fault by directly observing a signal transmitted through wiring formed in the integrated circuit chip using an electron beam.

However, unlike the stuck fault and the short fault, the timing fault does not necessarily always occur, and the timing fault diagnosis requires consideration of the fuzziness of the timing fault generation. For this reason, although it is necessary to simultaneously specify the time and location where the timing fault is observed, the method of diagnosing the stuck fault and the short fault cannot simultaneously specify the time and location. Therefore, the method of diagnosing the stuck fault and the short fault cannot be utilized to diagnose the timing fault.

In addition, according to the conventional fault diagnostic method which uses the electron beam, it is possible to diagnose the timing fault, but it is difficult to observe a signal in a layer other than a surface layer of the integrated circuit chip. In order to observe the signal in the layer other than the surface layer, it is necessary to form a key in the integrated circuit chip, and there was a problem in that the cost of the integrated circuit chip increases considerably.

On the other hand, the conventional fault diagnostic method which uses the electron beam cannot specify the exact location where the signal is to be observed, and signals at locations where the observation is originally unnecessary are also inevitably observed. As a result, there were problems in that it takes considerable time to specify the timing fault, and that it is difficult to utilize the conventional diagnostic method which uses the electron beam for the timing fault diagnosis from a practical point of view.

SUMMARY OF THE INVENTION

Accordingly, it is a general object of the present invention to provide a novel and useful timing fault diagnosis method and apparatus in which the problems described above are eliminated.

A first more specific object of the present invention is to provide a timing fault diagnosis method and apparatus which can diagnose, at a high speed, a timing fault of an integrated circuit chip in which a logic circuit is formed.

A second more specific object of the present invention is to provide a timing fault diagnosis method and apparatus which can diagnose, at a high speed, a timing fault of an integrated circuit chip in which a logic circuit is formed, without forming a hole in the integrated circuit chip, so that the cost of the integrated circuit chip can be reduced compared to the case where the hole is formed in the integrated circuit chip.

Still another object of the present invention is to provide a timing fault diagnosis method (1) for diagnosing a timing fault of an integrated circuit chip having a logic circuit formed therein, comprising the steps of: (a) obtaining fail information by applying a test pattern to an external input terminal of the integrated circuit chip; (b) extracting, from the logic circuit, a circuit which is to be subjected to a timing fault diagnosis, based on logic structure data of the logic circuit and the fail information; (c) creating a timing fault pattern by assuming a timing fault in each of elements having a possibility of generating a timing fault within the circuit which is to be subjected to the timing fault diagnosis; and (d) specifying an element which is assumed to generate the timing fault based on a timing fault diagnosis by comparing the timing fault pattern and the fail information. According to the timing fault diagnosis method (1) of the present invention, it is possible to specify the timing fault observation location to a specific location because the timing fault is diagnosed by comparing the fail information and the timing fault pattern and the element assumed to generate the timing fault is specified.

A further object of the present invention is to provide a timing fault diagnosis method (2) conforming to the timing fault diagnosis method (1) above, wherein the step (b) comprises the substeps of: including in the circuit which is to be subjected to the timing fault diagnosis an external output terminal to which a timing fault propagates; including in the circuit which is to be subjected to the timing fault diagnosis a circuit on an upstream side along a signal path when viewed from the external output terminal to which the timing fault propagates; and including in the circuit which is to be subjected to the timing fault diagnosis a circuit on a downstream side of a signal path when viewed from an external input terminal within the circuit on the upstream side when viewed from the external output terminal to which the timing fault propagates. According to the timing fault diagnosis method (2) of the present invention, it is possible to efficiently determine the circuit which is to be subjected to the timing fault diagnosis, in addition obtaining effects similar to those obtainable by the timing fault diagnosis method (1).

Another object of the present invention is to provide a timing fault diagnosis method (3) conforming to the timing fault diagnosis method (1) above, wherein the step (c) creates the timing fault pattern by always assuming that the timing fault occurs when input data applied to the element assumed to generate the timing fault undergoes a transition. According to the timing fault diagnosis method (3) of the present invention, it is possible to create a timing fault pattern by taking into consideration the fuzziness of the timing fault generation, and the element assumed to generate the timing fault can be specified with a high accuracy, in addition obtaining effects similar to those obtainable by the timing fault diagnosis method (1).

Still another object of the present invention is to provide a timing fault diagnosis method (4) conforming to the timing fault diagnosis method (1) above, wherein the step (c) measures in advance a standard value and a margin with respect to a timing operation for each test pattern, and creates the timing fault pattern by assuming that the timing fault occurs only with respect to a specific test pattern of the element assumed to generate the timing fault. According to the timing fault diagnosis method (4) of the present invention, it is possible to further narrow down the elements assumed to generate the timing fault as compared to the timing fault diagnosis method (3) above, and the element assumed to generate the timing fault can be specified more accurately as compared to the timing fault diagnosis method (3), in addition obtaining effects similar to those obtainable by the timing fault diagnosis method (1).

A further object of the present invention is to provide a timing fault diagnosis method (5) conforming to the timing fault diagnosis method (1) above, wherein the step (c) creates the timing fault pattern by excluding a timing fault propagation output from the timing fault pattern when an anticipated value of an output pattern has an undefined logic value. According to the timing fault diagnosis method (5) of the present invention, it is possible to further narrow down the timing fault propagation output as compared to the timing fault diagnosis method (3) above, and the element assumed to generate the timing fault can be specified more accurately as compared to the timing fault diagnosis method (3), in addition obtaining effects similar to those obtainable by the timing fault diagnosis method (1).

Another object of the present invention is to provide a timing fault diagnosis method (6) conforming to the timing fault diagnosis method (1) above, wherein the step (d) calculates an evaluation value which is used to specify the element assumed to generate the timing fault by dividing, a number of fail outputs included in the fail information matching a timing fault propagation output included in the timing fault pattern corresponding to the element assumed to generate the timing fault, by a number of timing fault propagation outputs included in the timing fault pattern corresponding to the element assumed to generate the timing fault. According to the timing fault diagnosis method (6) of the present invention, the element having a large evaluation value can be specified as an element having a high probability of being the element which generates the timing fault. For this reason, it is possible to specify the element assumed to generate the timing fault with a high accuracy, in addition obtaining effects similar to those obtainable by the timing fault diagnosis method (1).

Still object of the present invention is to provide a timing fault diagnosis method (7) conforming to the timing fault diagnosis method (1) above, wherein the step (d) calculates an evaluation value which is us ed to specify the element assumed to generate the timing fault by: calculating a first value by dividing, a number of fail output included in the fail information matching a timing fault propagation output included in the timing fault pattern corresponding to the element assumed to generate the timing fault, by a number of timing fault propagation outputs included only in the timing fault pattern corresponding to the element assumed to generate the timing fault; calculating a second value by dividing, the number of fail outputs included in the fail information matching the timing fault propagation output included in the timing fault pattern corresponding to the element assumed to generate the timing fault and a timing fault pattern other than the timing fault pattern corresponding to the element assumed to generate the timing fault, by a number of timing fault propagation outputs included in the timing fault pattern corresponding to the element assumed to generate the timing fault and the timing fault pattern other than the timing fault pattern corresponding to the element assumed to generate the timing fault; and weighting the first value more than the second value and adding the weighted first and second values to obtain the evaluation value. According to the timing fault diagnosis method (7) of the present invention, it is possible to further improve the accuracy of the evaluation value as compared to the timing fault diagnosis method (4) above, and the accuracy of specifying the element assumed to generate the timing fault can further be improved as compared to the timing fault diagnosis method (4), in addition obtaining effects similar to those obtainable by the timing fault diagnosis method (1).

A further object to the present invention is to provide a timing fault diagnosis method (8) conforming to the timing fault diagnosis method (1) above, which further comprises the steps of: (e) measuring in advance a standar value and a margin with respect to a timing operation for each of the elements having the posibility of generating the timing fault within the circuit which is to be subjected to the timing fault diagnosis, and narrowing down the element which has the possibility of generating the timing fault. According to the timing fault diagnosis method (8) of the present invention, it is possible to reduce the time required to create the timing fault pattern, in addition obtaining effects similar to those obtainable by the timing fault diagnosis method (1).

Another object of the present invention is to provide a timing fault diagnosis method (9) conforming to the timing fault diagnosis method (1) above, which further comprises the steps of: (e) specifying a timing fault observation location to a predetermined location on a surface layer of the integrated circuit chip and specifying a timing fault observation time, based on the test pattern, the logic structure data, a result of the timing fault diagnosis, and mask data. According to the timing fault diagnosis method (9) of the present invention, it is possible to observe the timing fault on the surface layer of the integrated circuit chip, without the need to form a hole in the integrated circuit chip so as to observe signals in underlayers under the surface layer and without the need to observe at times other than the specified observation time, in addition obtaining effects similar to those obtainable by the timing fault diagnosis method (1).

Still another object of the present invention is to provide a timing fault diagnosis method (10) conforming to the timing fault diagnosis method (9) above, wherein the step (e) comprises the substeps of: extracting a signal observable location from the surface layer of the integrated circuit chip based on the mask data; selecting the element assumed to generate the timing fault based on the result of the timing fault diagnosis; and carrying out a timing fault analyzing simulation based on the test pattern and the logic structure data, and calculating an evaluation value used to select the timing fault observation location and the timing fault observation time of the element assumed to generate the timing fault from the signal observable location on the surface layer of the integrated circuit chip according toe the timing fault diagnosis method (10) of the present invention, it is possible to efficiently determine the timing fault observation location and the timing fault observation time, in addition obtaining effects similar to those obtainable by the timing fault diagnosis method (9).

A further object of the present invention is to provide a timing fault diagnosis method (11) conforming to the timing fault diagnosis method (1) above, which further comprises the steps of: (e) re-extracting the circuit which is to be subjected to the timing fault diagnosis based on the logic structure data, the fail information and an observation result of the timing fault of the integrated circuit chip; (f) recreating the timing fault pattern assuming the timing fault for each of the elements having the possibility of generating the timing fault within the circuit which is to be subjected to the timing fault diagnosis; and (e) respecifying the element assumed to generate the timing fault by comparing the timing fault pattern and the fail information to diagnose the timing fault. According to the timing fault diagnosis method (11) of the present invention, it is possible to re-specify the timing fault observation location and efficiently confirm the element which generates the timing fault, in addition obtaining effects similar to those obtainable by the timing fault diagnosis method (1).

Another object of the present invention is to provide a timing fault diagnosis apparatus (12) for diagnosing a timing fault of an integrated circuit chip having a logic circuit formed therein, comprising: a timing fault diagnosis part diagnosing a timing fault based on a test pattern, logic structure data of the logic circuit and fail information, and specifying an element assumed to generate a timing fault. According to the timing fault diagnosis apparatus (12) of the present invention, it is possible to specify the timing fault observation location to a specific location because it is possible to diagnose the timing fault by comparing the fail information and the timing fault pattern and specify the element assumed to generate the timing fault.

Still another object of the present invention is to provide a timing fault diagnosis apparatus (13) conforming to the timing fault diagnosis apparatus (12) above, wherein the timing fault diagnosis part comprises: timing fault pattern creating means for extracting the circuit which is to be subjected to the timing fault diagnosis from the logic circuit, based on the test pattern, the logic structure data and the fail information, and creating a timing fault pattern assuming a timing fault for each of elements having a possibility of generating a timing fault within the circuit which is to be subjected to the timing fault diagnosis; evaluation value calculating means for comparing the fail information and the timing fault pattern, and calculating an evaluation value used to specify the element assumed to generate the timing fault; and timing fault diagnosis means for diagnosing a timing fault based on the evaluation value, and specifying the element assumed to generate the timing fault. According to the timing fault diagnosis apparatus (13) of the present invention, it is possible to simplify the structure of the timing fault diagnosis part, in addition obtaining effects similar to those obtainable by the timing fault diagnosis apparatus (12).

A further object of the present invention is to provide a timing fault diagnosis apparatus (14) conforming to the timing fault diagnosis apparatus (12) above, which further comprises: a timing fault observation location/observation time specifying part specifying a timing fault observation location to a predetermined location on a surface layer of the integrated circuit chip and specifying a timing fault observation time, based on the test pattern, the logic structure data, a result of a timing fault diagnosis, and mask data of the logic circuit. According to the timing fault diagnosis apparatus (14) of the present invention, it is unnecessary to form a hole in the integrated circuit chip so as to observe signals in the underlayers under the surface layer, and unnecessary to observe the timing fault at times other than the specified time, in addition obtaining effects similar to those obtainable by the timing fault diagnosis apparatus (12).

Another object of the present invention is to provide a timing fault diagnosis apparatus (15) conforming to the timing fault diagnosis apparatus (14) above, wherein the timing fault observation location/observation time specifying part comprises: signal observable location extracting means for extracting a signal observable location from the surface layer of the integrated circuit chip, based on the mask data; and a timing fault analyzing simulator carrying out a timing fault analyzing simulation based on the test pattern and the logic structure data, and selecting the timing fault observation location and the timing fault observation time of the element assumed to generate the timing fault from the signal observable location on the surface layer of the integrated circuit chip. According to the timing fault diagnosis apparatus (15) of the present invention, it is possible to simplify the structure of the timing fault observation location/observation time specifying part, in addition obtaining effects similar to those obtainable by the timing fault diagnosis apparatus (14).

Still another object of the present invention is to provide a timing fault diagnosis apparatus (16) conforming to the timing fault diagnosis apparatus (15) above, wherein the timing fault diagnosis part comprises: means for inputting an observation result obtained by observing a timing fault of the integrated circuit chip, and re-specifying an element assumed to generate the timing fault. According to the timing fault diagnosis apparatus (16) of the present invention, it is possible to re-specify the timing fault observation location and efficiently confirm the element which generates the timing fault, in addition obtaining effects similar to those obtainable by the timing fault diagnosis apparatus (15).

A further object of the present invention is to provide a timing fault diagnosis apparatus (17) conforming to the timing fault diagnosis part (12) above, wherein the timing fault diagnosis part comprises: a timing fault pattern creating unit extracting said circuit which is to be subjected to the timing fault diagnosis from the logic circuit, based on the test pattern, the logic structure data and the fail information, and creating a timing fault pattern assuming a timing fault for each of elements having a possibility of generating a timing fault within said circuit which is to be subjected to the timing fault diagnosis; an evaluation value calculating unit comparing the fail information and the timing fault pattern, and calculating an evaluation value used to specify the element assumed to generate the timing fault; and a timing fault diagnosis unit diagnosing a timing fault based on the evaluation value, and specifying the element assumed to generate the timing fault. According to the timing fault diagnosis apparatus (17) of the present invention, it is possible to simplify the structure of the timing fault diagnosis part, in addition obtaining effects similar to those obtainable by the timing fault diagnosis apparatus (12).

Another object of the present invention is to provide a timing fault diagnosis apparatus (18) conforming to the timing fault diagnosis apparatus (14) above, wherein the timing fault observation location/observation time specifying part comprises: a signal observable location extracting unit extracting a signal observable location from the surface layer of the integrated circuit chip, based on the mask data; and a timing fault analyzing simulator carrying out a timing fault analyzing simulation based on the test pattern and the logic structure data, and selecting the timing fault observation location and the timing fault observation time of the element assumed to generate the timing fault from the signal observable location on the surface layer of the integrated circuit chip. According to the timing fault diagnosis apparatus (18) of the present invention, it is possible to simplify the structure of the timing fault observation location/ observation time specifying part, in addition obtaining effects similar to those obtainable by the timing fault diagnosis apparatus (14).

Still another object of the present invention is to provide a timing fault diagnosis apparatus (19) conforming to the timing fault diagnosis apparatus (15) above, wherein the timing fault diagnosis part comprises: an input unit inputting an observation result obtained by observing a timing fault of the integrated circuit chip, and re-specifying an element assumed to generate the timing fault. According to the timing fault diagnosis apparatus (19) of the present invention, it is possible to re-specify the timing fault observation location and efficiently confirm the element which generates the timing fault, in addition obtaining effects similar to those obtainable by the timing fault diagnosis apparatus (15).

Other objects and further features of the present invention will be apparent from the following detailed description when read in conjunction with the accompanying drawings.

BRIEF DESCRIPTION OF THE DRAWINGS

FIG. 10 is a diagram showing anticipated values of output patterns when the test patterns shown in FIG. 9 are applied to the logic circuit shown in FIG. 8;

FIG. 11 is a diagram showing fail information of the logic circuit shown in FIG. 8;

FIG. 14 is a diagram showing timing fault patterns which are created by assuming the timing fault in a first flip-flop circuit of the logic circuit shown in FIG. 8;

FIG. 15 is a diagram showing timing fault patterns which are created by assuming the timing fault in a second flip-flop circuit of the logic circuit shown in FIG. 8;

FIG. 16 is a diagram showing timing fault patterns which are created by assuming the timing fault in a third flip-flop circuit of the logic circuit shown in FIG. 8;

FIG. 17 is a diagram showing timing fault patterns which are created by assuming the timing fault in a fourth flip-flop circuit of the logic circuit shown in FIG. 8;

FIG. 18 is a diagram showing other test patterns applied to the logic circuit shown in FIG. 8;

FIG. 22 is a diagram showing a simulation result of the timing fault analysis when the timing fault is assumed in a first flip-flop circuit within the circuit which is to be subjected to the timing fault diagnosis;

FIG. 26 is a diagram showing test patterns applied to the circuit shown in FIG. 24 which is to be subjected to the timing fault diagnosis and anticipated values;

FIG. 27 is a diagram showing predicted fail information of the circuit shown in FIG. 24 which is to be subjected to the timing fault diagnosis;

FIG. 30 is a diagram showing test patterns applied to the circuit shown in FIG. 29 which is to be subjected to the timing fault diagnosis, anticipated values and fail information.

DESCRIPTION OF THE PREFERRED EMBODIMENTS

Figure 1:
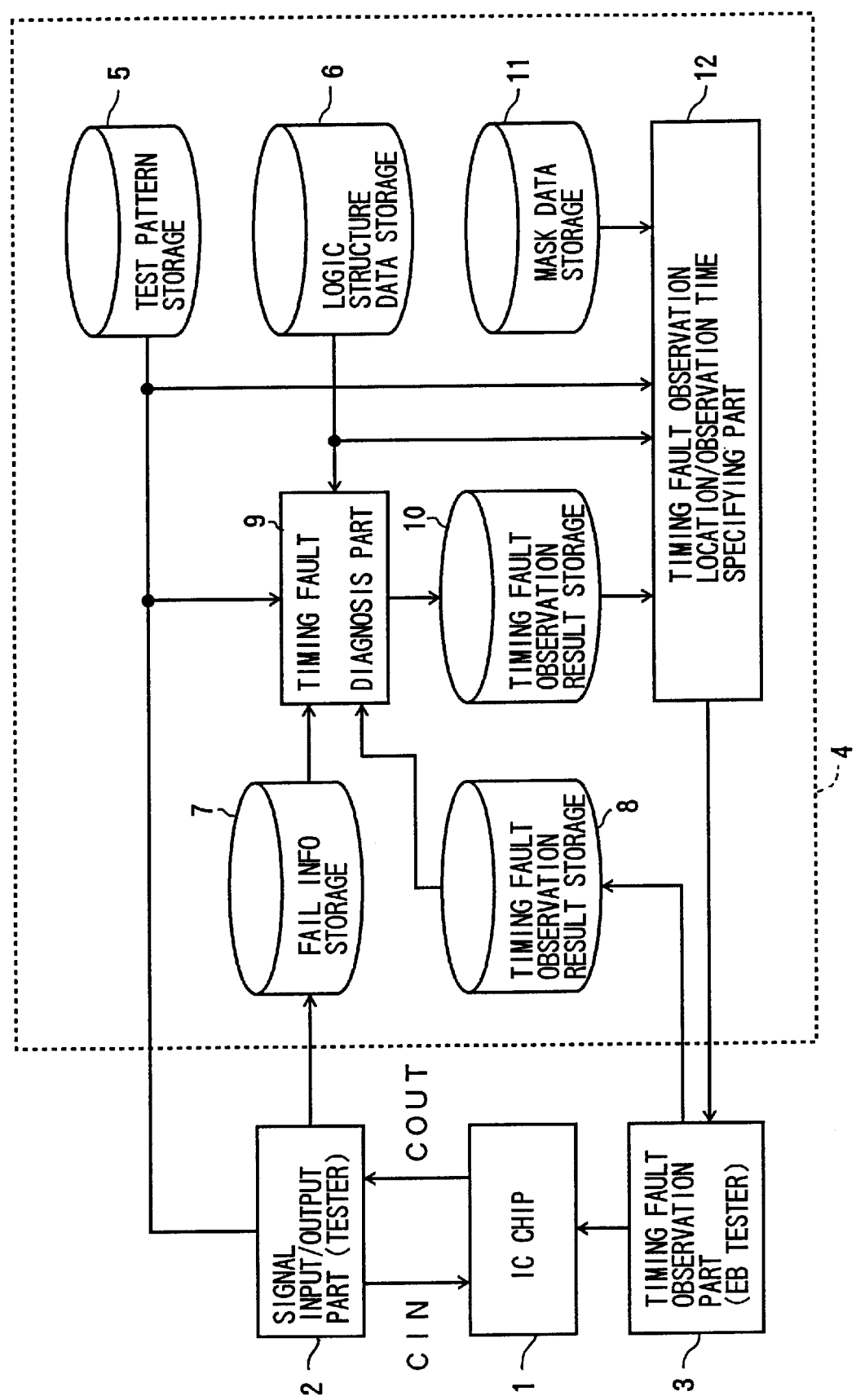
FIG. 1 is a system block diagram showing an important part of an embodiment of a timing fault diagnosis apparatus according to the present invention together with an integrated circuit chip which is to be diagnosed.

FIG. 1 is a system block diagram showing an important part of an embodiment of a timing fault diagnosis apparatus according to the present invention together with an integrated circuit chip which is to be diagnosed.

In FIG. 1, an integrated circuit chip 1 has a logic circuit formed therein, and this integrated circuit chip 1 is to be subjected to a timing fault diagnosis. A signal input/output part 2 forms a tester which applies a test pattern (input logic value) to an input terminal CIN, compares an output pattern (output logic value) output from an output terminal COUT of the integrated circuit chip 1 and an anticipated value, and creates fail information based on the comparison. The signal input/output part 2 will hereinafter simply be referred to as a tester 2.

A timing fault observation part 3 forms an electron beam (EB) tester. The timing fault observation part 3 observes a timing, fault of the integrated circuit chip 1 by directly observing a signal at a specified location of the integrated circuit chip 1. The timing fault observation part 3 will hereinafter simply be referred to as an EB tester 3.

In this embodiment, a timing fault diagnosis apparatus 4 includes a test pattern storage 5 which stores test patterns, and a logic structure data storage 6 which stores logic structure data of logic circuits formed in the integrated circuit chip 1.

The timing fault diagnosis apparatus 4 also includes a fail information storage 7 which stores fail information output from the tester 2, and a timing fault observation result storage 8 which stores a timing fault observation result output from the EB tester 3.

The timing fault diagnosis apparatus 4 further includes a timing fault diagnosis part 9, a timing fault diagnosis result storage 10, a mask data storage 11, and a timing fault observation location/observation time specifying part 12.

The timing fault diagnosis part 9 reads the test pattern, the logic structure data and the fail information, and also reads the timing fault observation result in a case where the timing fault is observed by the EB tester 3. The timing fault diagnosis part 9 diagnoses the timing fault based on the read information, and assumes an element which is generating the timing fault.

The timing fault diagnosis result storage 10 stores a timing fault diagnosis result obtained from the timing fault diagnosis part 9. The mask data storage 11 stores mask data of the integrated circuit chip 1.

The timing fault observation location/observation time specifying part 12 reads the test pattern, the logic structure data and the timing fault diagnosis result, and specifies a timing fault observation location and observation time of the EB tester 3.

Figure 2:
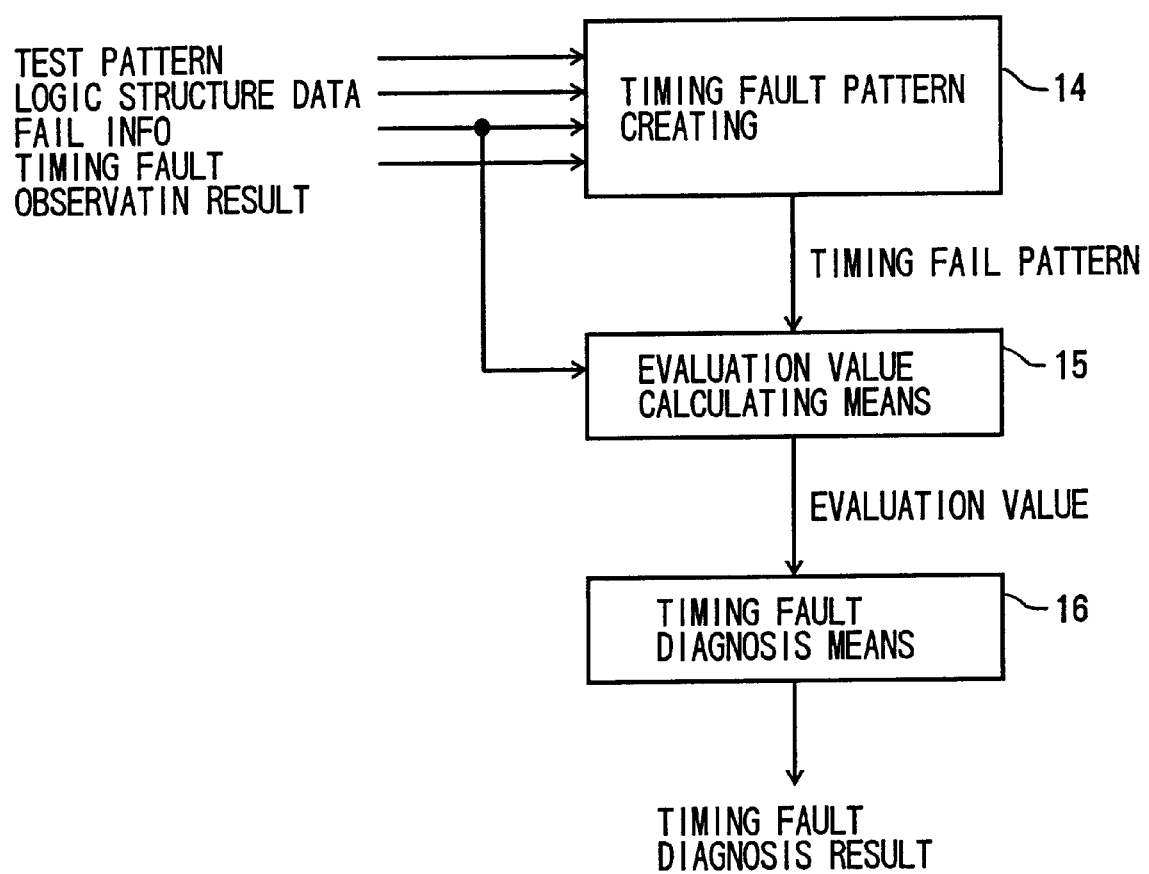
FIG. 2 is a system block diagram showing the construction of a timing fault diagnosis part of the embodiment of the timing fault diagnosis apparatus.

FIG. 2 is a system block diagram showing the construction of the timing fault diagnosis part 9 of the timing fault diagnosis apparatus 4 shown in FIG. 1. As shown in FIG. 2, the timing fault diagnosis part 9 includes a timing fault pattern creating means 14, an evaluation value calculating means 15, and a timing fault diagnosis means 16.

The timing fault pattern creating means 14 reads the test pattern, the logic structure data and the fail information, and also reads the timing fault observation result in the case where the timing fault is observed by the EB tester 3. The timing fault pattern creating means 14 extracts a circuit which is to be subjected to the timing fault diagnosis, based on the read information, and creates timing fault patterns by assuming a timing fault for each element which has a possibility of generating the timing fault within the circuit which is to be subjected to the timing fault diagnosis.

The evaluation value calculating means 15 compares the timing fault patterns and the fail information, and calculates an evaluation value which is required to specify an element which is assumed to generate the timing fault, with respect to each element which has the possibility of generating the timing fault. The timing fault diagnosis means 16 specifies the element which is assumed to generate the timing fault, based on the evaluation value calculated by the evaluation value calculating means 15.

Figure 3:
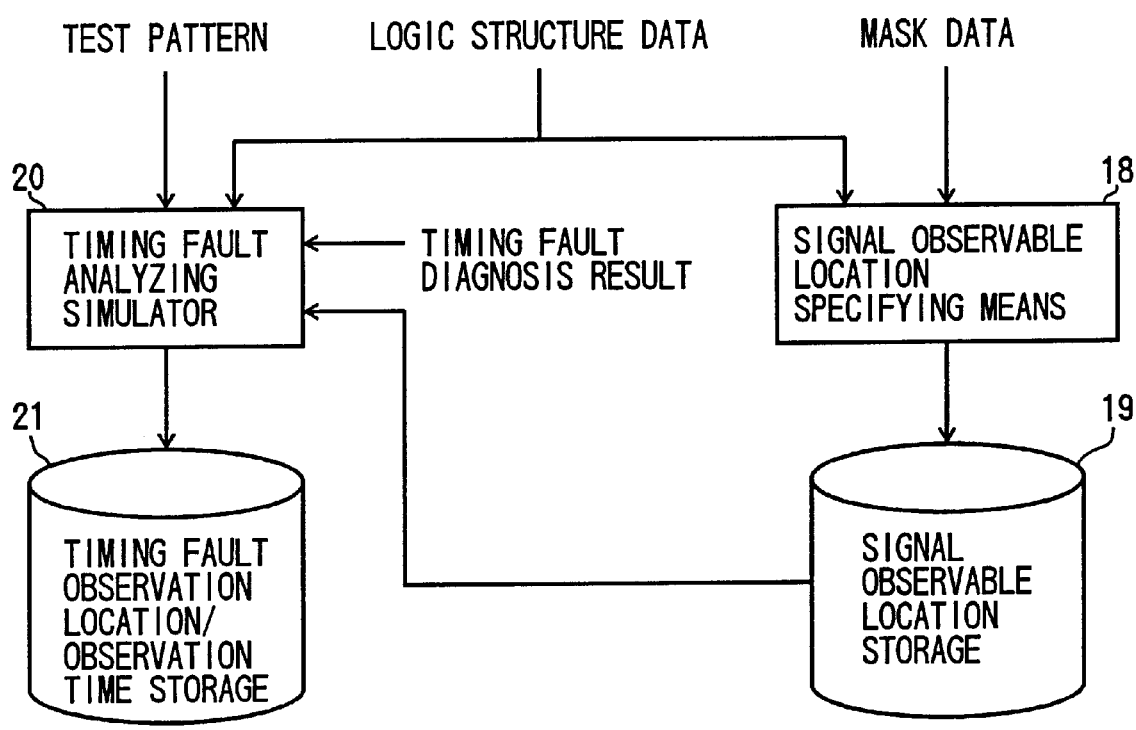
FIG. 3 is a system block diagram showing the construction of a timing fault observation location/observation time specifying part of the embodiment of the timing fault diagnosis apparatus.

FIG. 3 is a system block diagram showing the construction of the timing fault observation location/observation time specifying part 12 of the timing fault diagnosis apparatus 4 shown in FIG. 1. The timing fault observation location/observation time specifying part 12 shown in FIG. 3 includes a signal observable location specifying means 18, a signal observable location storage 19, a timing fault analyzing simulator 20, and a timing fault observation location/observation time storage 21.

The signal observable location specifying means 18 reads mask data, and specifies a location where the signal observation is possible on the surface layer of the integrated circuit chip 1. The signal observable location storage 19 stores signal observable location data output from the signal observable location specifying means 18.

The timing fault analyzing simulator 20 reads the test pattern, the logic structure data, the timing fault diagnosis result and signal observable location data, and specifies the timing fault observation location/observation time of the integrated circuit chip 1. The timing fault observation location/observation time storage 21 stores timing fault observation location/observation time data output from the timing fault analyzing simulator 20.

The various means 14, 15, 16 and 18 shown in FIGS. 2 and 3 may be, realized by software or hardware units.

Figure 4:
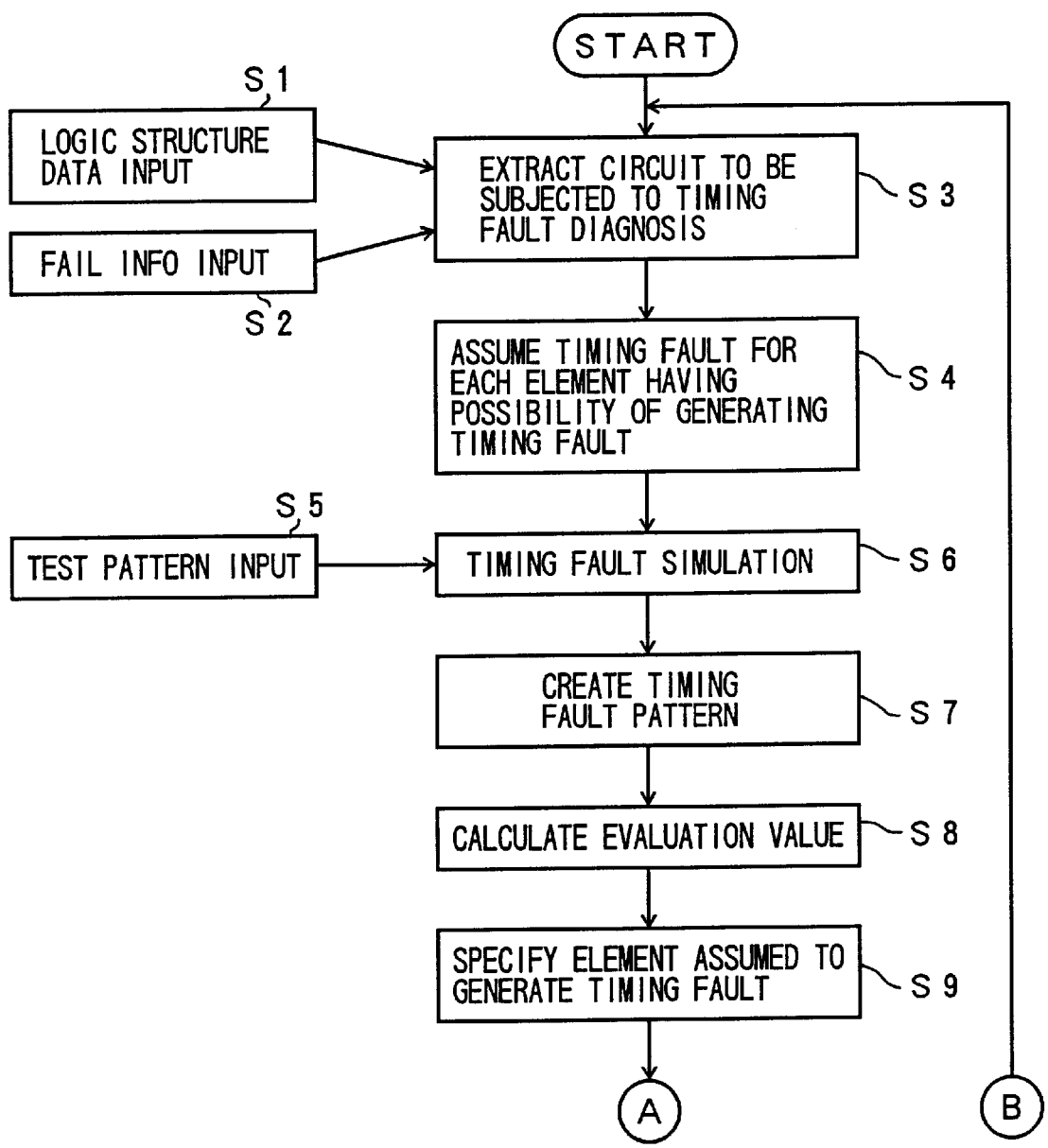
FIG. 4 is a flow chart for explaining the operation of the embodiment of the timing fault diagnosis apparatus.
Figure 5:
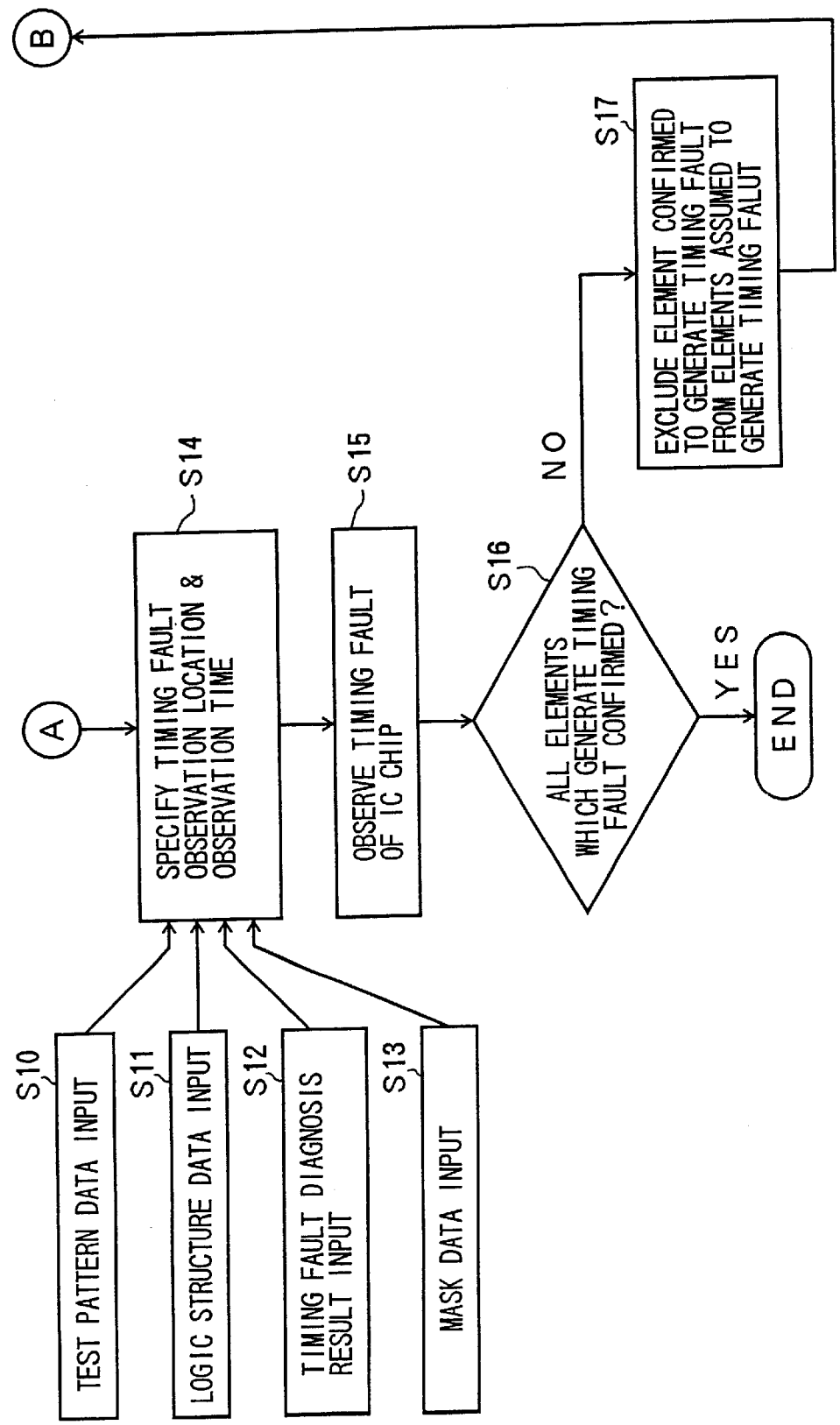
FIG. 5 is a flow chart for explaining the method of extracting a circuit which is to be subjected to the timing fault diagnosis in the embodiment of the timing fault diagnosis apparatus.

FIG. 4 is a flow chart for explaining the operation of this embodiment of the timing fault diagnosis apparatus, that is, an embodiment of a timing fault diagnosis method according to the present invention FIG. 5 is a flow chart for explaining the method of extracting the circuit which is to be subjected to the timing fault diagnosis in this embodiment of the timing fault diagnosis apparatus.

In FIG. 4, in the timing fault pattern creating means 14 of the timing fault diagnosis part 9, a step S1 inputs the logic structure data, and a step S2 inputs the fail information. In addition, a step S3 detects the circuit which is to be subjected to the timing fault diagnosis, from the logic circuit which is formed in the integrated circuit chip 1.

Then, in the timing fault pattern creating means 14, a step S4 assumes the element which has the possibility of generating the timing fault within the circuit which is to be subjected to the timing fault diagnosis. A step S5 inputs the test pattern every time the timing fault is assumed in one element, a step S6 carries out a timing fault simulation, and a step S7 creates the timing fault patterns. In other words, the timing fault pattern which assumes the timing fault is created for each element which has the possibility of generating the timing fault within the circuit which is to be subjected to the timing fault diagnosis.

Next, in the evaluation value calculating means 15, a step S8 calculates the evaluation value which is required to specify the element which is assumed to generate the timing fault, by comparing the fail information and the timing fault pattern which is created for each element which is assumed to generate the timing fault. After the evaluation value is calculated, in the timing fault diagnosis means 16, a step 59 specifies the element which is assumed to generate the timing fault.

Then, in the timing fault observation location/observation time specifying part 12, a step S10 shown in FIG. 5 inputs the test pattern data, a step S11 inputs the logic structure data, a step S12 inputs the timing fault diagnosis result, and a step S13 inputs the mask data. In addition, a step S14 specifies the timing fault observation location/observation time of the EB tester 3.

In the EB tester 3, a step S15 observes the timing fault of the integrated circuit chip 1 based on the timing observation location/observation time data. Thereafter, a step S16 decides whether or not all of the elements which generate the timing fault has been confirmed. The process of observing the timing fault ends if the decision result in the step S16 is YES.

On the other hand, if the decision result in the step S16 is NO, a step S17 excludes the element which is confirmed to generate the timing fault from the elements which are assumed to generate the timing fault, and the process returns to the step S1 shown in FIG. 4. Hence, the steps S17 and S1 through S16 are repeated until all of the elements which generate the timing fault are confirmed.

Figure 6:
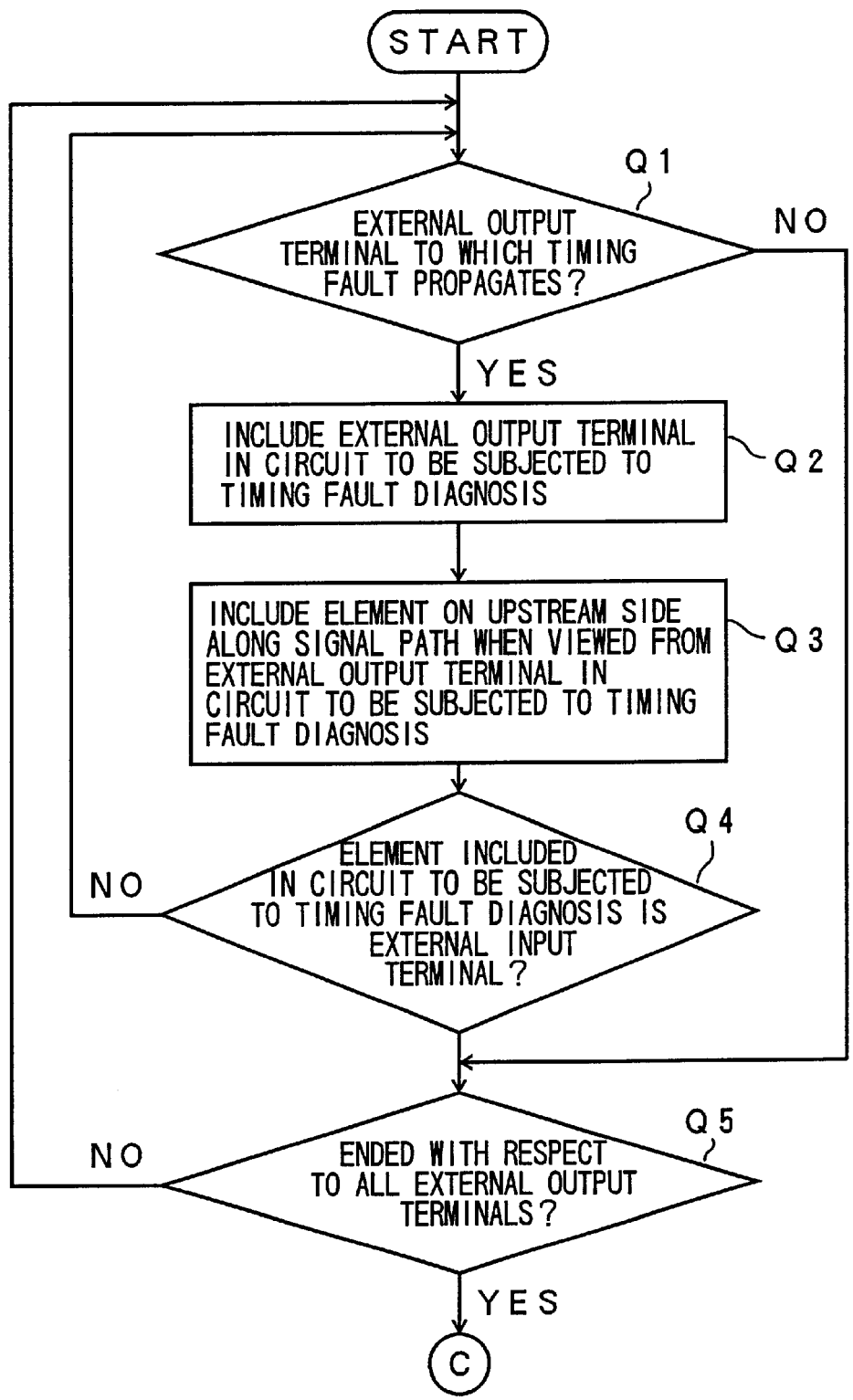
FIG. 6 is a flow chart for explaining the method of extracting the circuit which is to be subjected to the timing fault diagnosis in the embodiment of the timing fault diagnosis apparatus.
Figure 7:
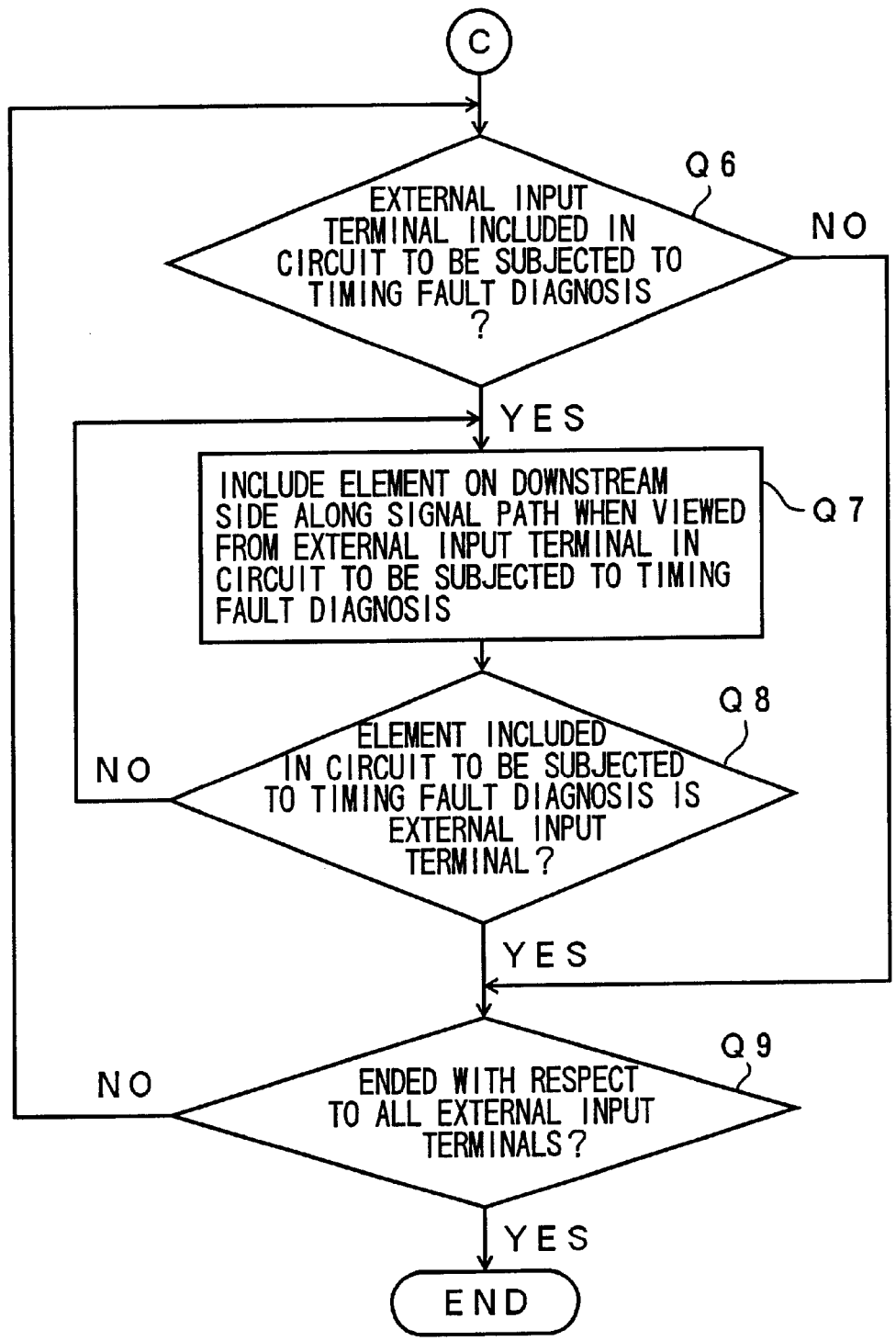
FIG. 7 is a flow chart for explaining the method of extracting the circuit which is to be subjected to the timing fault diagnosis in the embodiment of the timing fault diagnosis apparatus.

FIGS. 6 and 7 are flow charts for explaining the method of extracting the circuit which is to be subjected to the timing fault diagnosis from the logic circuit formed in the integrated circuit chip 1.

In FIG. 6, in a case where the circuit which is to be subjected to the timing fault diagnosis is extracted from the logic circuit formed in the integrated circuit chip 1, a step Q1 first decides whether or not an external output terminal is one of external terminals through which the timing fault propagates. If the decision result in the step Q1 is YES, a step Q2 includes this external output terminal in the circuit which is to be subjected to the timing fault diagnosis. On the other hand, if the decision result in the step Q1 is NO, the process advances to a step Q5 which will be described later.

Next, a step Q3 includes in the circuit which is to be subjected to the timing fault diagnosis an element which is provided on an upstream side along a signal path when viewed from the external output terminal which is included in the circuit which is to be subjected to the timing fault diagnosis. Then, a step Q4 decides whether or not the element included in the circuit which is to be subjected to the timing fault diagnosis is an external input terminal. The process returns to the step Q1 if the decision result in the step Q4 is NO. Hence, the steps Q1 through Q4 are repeated until the element included in the circuit which is to be subjected to the timing fault diagnosis becomes the external input terminal.

If the decision result in the step Q1 is NO or the decision result in the step Q4 is YES, the step Q5 decides whether or not the step Q1 or the steps Q1 through Q4 are ended with respect to all of the external output terminals. The process returns to the step Q1 if the decision result in the step Q5 is NO. On the other hand, the process advances to a step Q6 shown in FIG. 7 if the decision result in the step Q5 is YES.

Accordingly, when the step Q1 or the steps Q1 through Q4 are ended with respect to all of the external output terminals, the step Q6 decides whether or not one of the external input terminals is the external input terminal included in the circuit which is to be subjected to the timing fault diagnosis. The process advances to a step Q9 which will be described later if the decision result in the step Q6 is NO. On the other hand, the process advances to a step Q7 if the decision result in the step Q6 is YES.

The step Q7 includes in the circuit which is to be subjected to the timing fault diagnosis an element which is provided on a downstream side along a signal path when viewed from the external input terminal which is included in the circuit which is to be subjected to the timing- fault diagnosis.

Then, a step Q8 decides whether or not the element included in the circuit which is to be subjected to the timing fault diagnosis is an external output terminal. The process returns to the step Q7 if the decision result in the step Q8 is NO. Hence, the steps Q7 and Q8 are repeated until the element included in the circuit which is to be subjected to the timing fault diagnosis becomes the external output terminal.

If the decision result in the step Q6 is NO or the decision result in the step Q8 is YES, the step Q9 decides whether or not the step Q6 or the steps Q6 through Q8 are ended with respect to all of the external input terminals. The process returns, to the step Q6 if the decision result in the step Q9 is NO. On the other hand, the process of extracting the circuit which is to be subjected to the timing fault diagnosis ends if the decision result in the step, Q9 is YES.

Figures 8, 9:
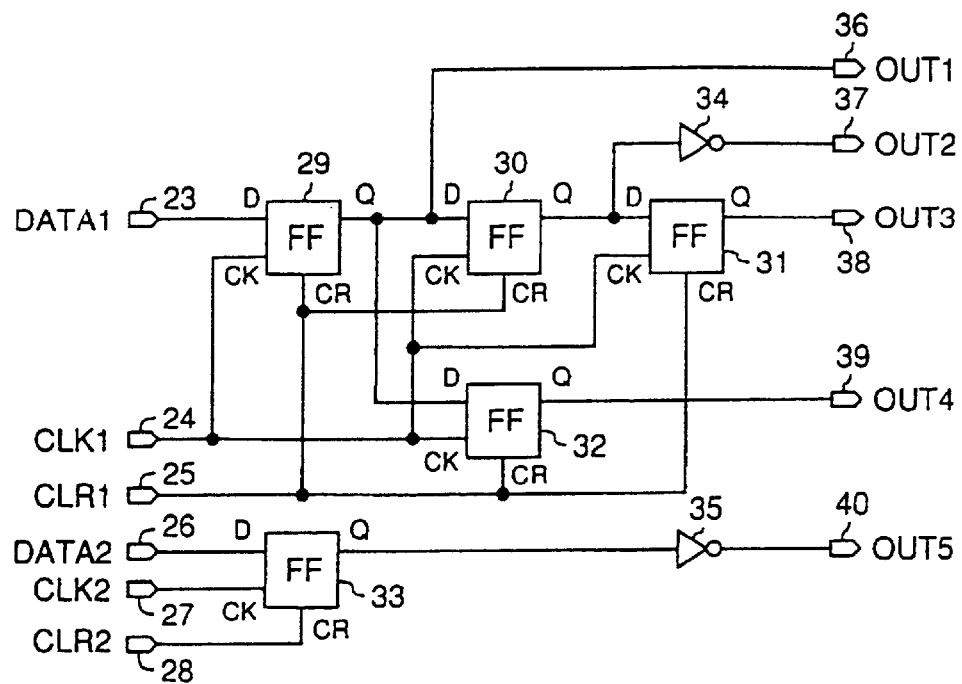
FIG. 8 is a circuit diagram showing a logic circuit which is assumed to be formed in the integrated circuit chip in the embodiment of the timing fault diagnosis apparatus.
FIG. 9 is a diagram showing test patterns applied to the logic circuit shown in FIG. 8.

FIGS. 8 through 17 are diagrams for explaining the operation of the timing fault diagnosis part 9 in more detail FIG. 8 is a circuit diagram showing a logic circuit which is assumed to be formed in the integrated circuit chip 1.

In FIG. 8, the logic circuit which is assumed to be formed in the integrated circuit chip 1 includes external input terminals 23 through 28, flip-flip circuits (FF) 29 through 33, inverters 34 and 35, and external output terminals 36 through 40 which are connected as shown. Input data are denoted by DATA1 and DATA2, and clocks are denoted by CLK1 and CLK2. In addition, clear signals are denoted by CLR1 and CLR2, and output data are denoted by OUT1 through OUT5.

FIG. 9 is a diagram showing test patterns applied to the external input terminals 23 through 28 of the logic circuit shown in FIG. 8. In this particular case, test patterns P0 through P6 are successively applied to the external input terminals 23 through 28

In FIG. 9, "1" denotes a logic value "1", "0" denotes a logic value "0", and "P" denotes a positive pulse wave Hence, in the test pattern P0, the clear signals CLR1 and CLR2 are applied to the external input terminals 25 and 28, and internal memories of the flip-flop circuits 29 through 33 are cleared to "0".

FIG. 10 is a diagram showing anticipated values of the output patterns when the test patterns P0 through P6 shown in FIG. 9 are applied to the logic external input terminals 23 through 28 of the circuit shown in FIG. 8. In FIG. 10, "1" denotes a logic value "1", and "0" denotes a logic value "0".

When using this embodiment of the timing fault diagnosis apparatus according to the present invention, the test patterns P0 through P6 shown in FIG. 9, for example, are applied to the external input terminals 23 through 28 of the integrated circuit chip 1. The output patterns obtained responsive to the test patterns P0 through P6 are compared with the anticipated values shown in FIG. 10, and the fail information indicating whether or not the compared values match is obtained.

FIG. 11 is a diagram showing fail information of the logic circuit shown in FIG. 8. That is, FIG. 11 shows the fail information which is obtained when the test patterns P0 through P6 shown in FIG. 9 are applied to the external input terminals 23 through 28, and the output patterns obtained responsive to the test patterns P0 through P6 are compared with the anticipated values shown in FIG. 10.

In FIG. 11, "E" denotes an output (fail output) which indicates that the logic values of the output pattern do not match the logic values of the anticipated values, and "-" denotes an output (normal output) which indicates that the logic values of the output pattern match the logic values of the anticipated From the fail information shown in FIG 11, it is possible to know that the timing fault propagates to the external output terminal 37 when the test pattern P2 or P6 is applied to the external input terminals 23 through 28, the timing fault propagates to the external output terminal 38 when the test pattern P3 is applied to the external input terminals 23 through 28, and the timing fault propagates to the external output terminal 39 when the test pattern P2, P5 or P6 is applied to the external input terminals 23 through 28.

Accordingly, in the timing fault pattern creating means 14 of the timing fault diagnosis part 9, the external output terminal 37 is first included in the circuit which is to be subjected to the timing fault diagnosis. In addition, an element located on an upstream side along a signal path when viewed from the external output terminal 37 is included in the circuit which is to be subjected to the timing fault diagnosis until this element becomes the external: input terminal.

Then,the external output terminal 38 is included in the circuit which is to be subjected to the timing fault diagnosis. An element located on an upstream side along a signal path when viewed from the external output terminal 38 is included in the circuit which is to be subjected to the timing fault diagnosis until this element becomes the external input terminal.

Next, the external output terminal 39 is included in the circuit which is to be subjected to the timing fault diagnosis An element located on an upstream side along a signal path when viewed from the external output terminal 39 is included in the circuit which is to be subjected to the timing fault diagnosis until this element becomes the external input terminal.

Figure 12:
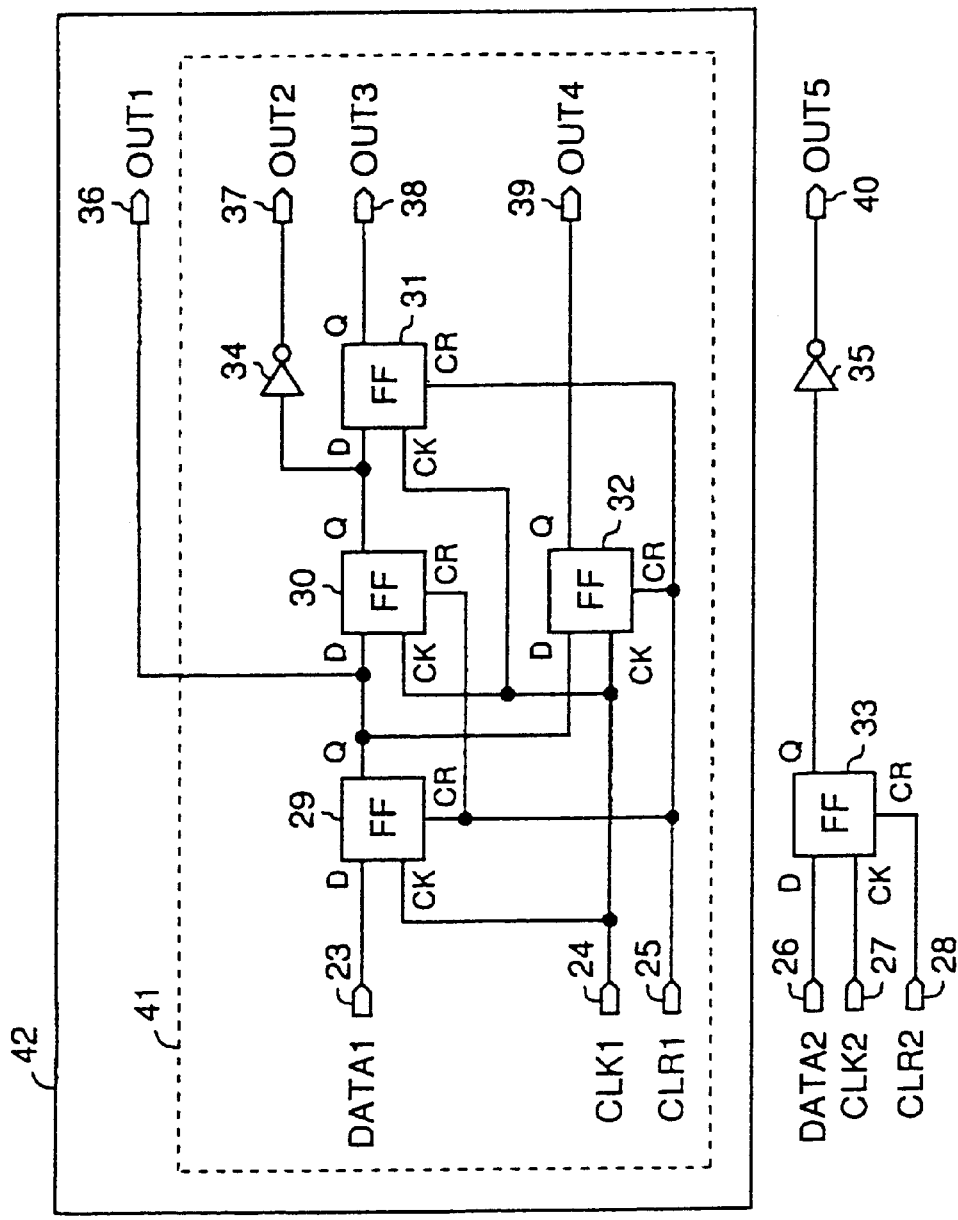
FIG. 12 is a circuit diagram for explaining a method of extracting a circuit which is to be subjected to the timing fault diagnosis from the logic circuit shown in FIG. 8.
Figure 13:
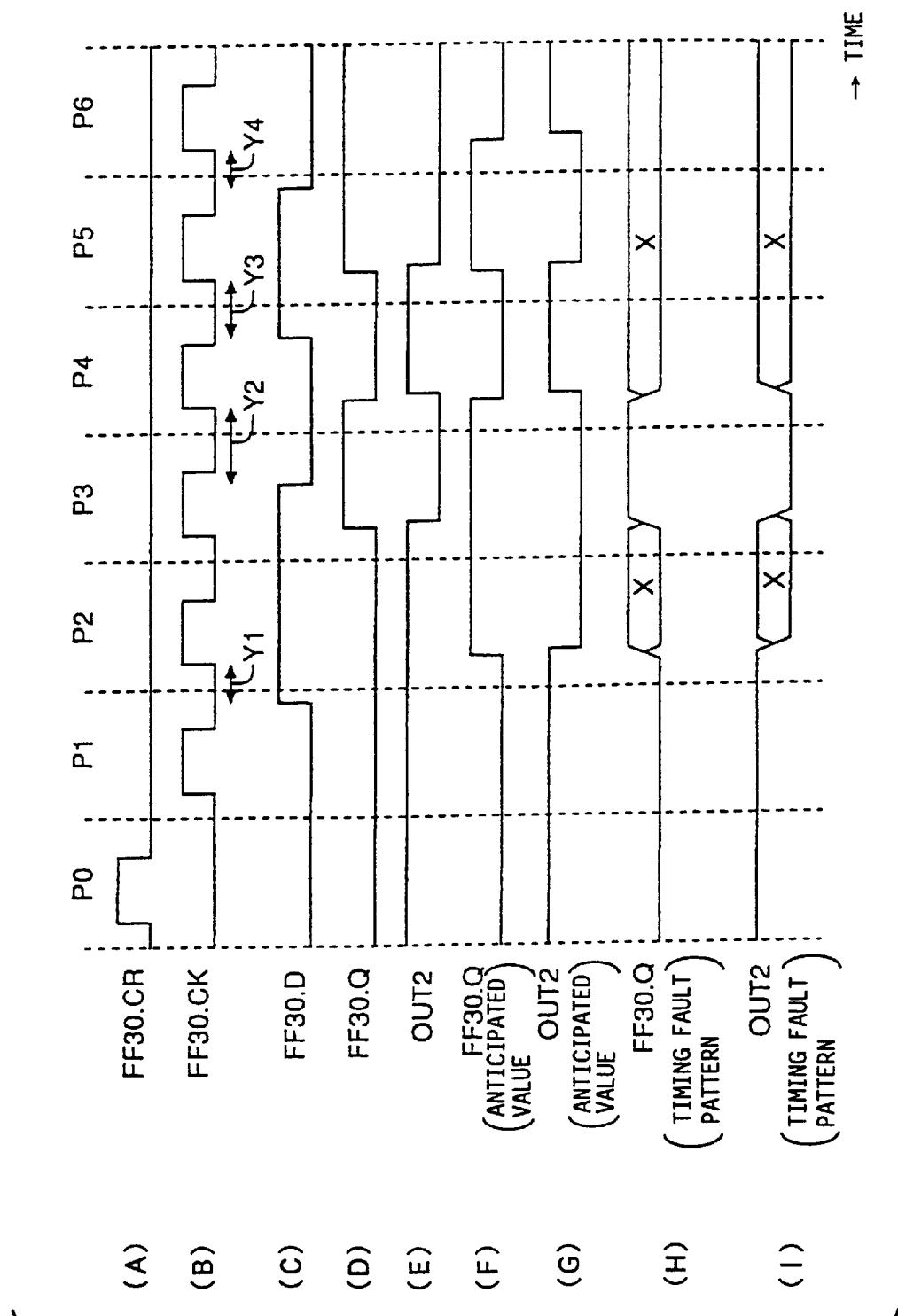
FIGS. 13(A) through 13(I) are time charts for explaining a method of creating timing fault patterns when a set-up timing fault is assumed in a specific flip-flop circuit within the logic circuit shown in FIG. 8.
Figure 19:
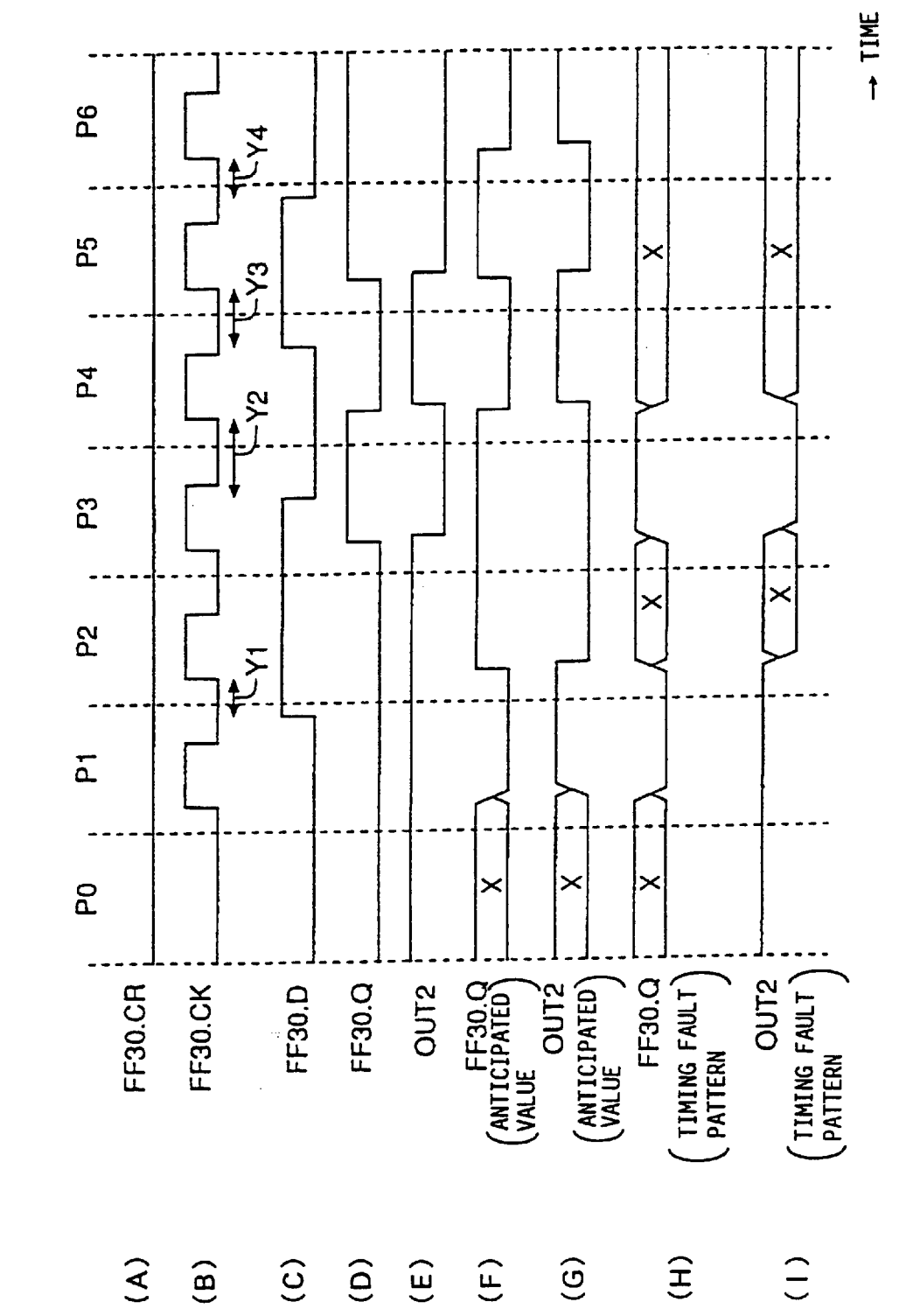
FIGS. 19(A) through 19(I) are time charts for explaining a method of creating timing fault patterns when a set-up timing fault is assumed in a specific flip-flop circuit within the logic circuit shown in FIG. 8 in a case where the test patterns shown in FIG. 18 are used.

Therefore, when the circuit which is to be subjected to the timing fault diagnosis is extracted by going upstream along the signal paths from the external output terminals 37, 38 and 39, a circuit surrounded by a dotted line 41 in FIG. 12 is, extracted as the circuit which is to be subjected to the timing fault diagnosis. This circuit surrounded by the dotted line 41 includes the external input terminals 23 through 25, the flip-flop circuits 29 through 32, the inverter 34 and the external output terminals 37 through 39.

Next, an element located on a downstream side along a signal path when viewed from the external input terminal 23 is included in the circuit which is to be subjected to the timing fault diagnosis until this element becomes the external output terminal. Then, an element located on a downstream side along a signal path when viewed from the external input terminal 24 is included in the circuit which is to be subjected to the timing fault diagnosis until this element becomes the external output terminal. Thereafter, an element located on a downstream side along a signal path when viewed from the external input terminal 25 is included in the circuit which is to be subjected to the timing fault diagnosis until this element becomes the external output terminal.

Therefore, when the circuit which is to be subjected to the timing fault diagnosis is extracted along signal flows from the external input terminals 23, 24 and 25, a circuit surrounded by a solid line 42 in FIG. 12 is extracted as the circuit which is to be subjected to the timing fault diagnosis. This circuit surrounded by the solid line 42 includes the external input terminals 23 through 25, the flip-flop circuits 29 through 32, the inverter 34 and the external output terminals 36 through 39.

In this particular case, the flip-flop circuits 29 through 32 which are synchronous elements within the circuit which is surrounded by the solid line 42 and is to be subjected to the timing fault diagnosis, are assumed to be the elements which have the possibility of generating the timing fault.

FIGS. 13(A) through 13(I) are time charts for explaining a method of creating timing fault patterns when a set-up timing fault is assumed in a specific flip-flop circuit 30 within the logic circuit shown in FIG. 8.

FIG. 13(A) shows a clear signal applied to a clear signal input terminal CR of the flip-flop circuit 30 FIG. 13(B) shows a clock signal applied to a clock input terminal CK of the flip-flop circuit 30. In FIG. 13(B), Y1, Y2, Y3 and Y4 indicate set-up times FIG. 13(C) shows a data signal applied to a data input terminal D of the flip-flop circuit 30.

FIG. 13(D) shows a data output from a positive phase output terminal Q of the flip-flop circuit 30. FIG. 13(E) shows the output data OUT2 output from the external output terminal 37.

FIG. 13(F) shows an anticipated value of the data output from the positive phase output terminal Q of the flip-flop circuit 30. FIG. 13(G) shows an anticipated value of the output data OUT2 output from the external output terminal 37.

In addition, FIG. 13(H) shows a timing fault pattern output to the positive phase output terminal Q of the flip-flop circuit 30. FIG. 13(I) shows a timing fault pattern output from the external output terminal 37.

In other words, the flip-flop circuit 30 inputs the output of the flip-flop circuit 29 at the rising edge of the clock signal CK, and when the flip-flop circuit 30 has no timing fault, logic values matching the anticipated values can be obtained from the positive phase output terminal Q of the flip-flop circuit 30 and the external output terminal 37.

However, in a case where the test pattern changes from P1 to P2 and in a case where the test pattern changes from P5 and P6, the flip-flop circuit 30 cannot correctly input the input signal because the set-up time is short. As a result, there is a possibility that an erroneous signal is transferred to the positive phase output terminal Q of the flip-flop circuit 30 and the external output terminal 37.

On the other hand, in a case where the test pattern changes from P3 to P4 and in a case where the test pattern changes from P4 to P5, the flip-flop circuit 30 can correctly input the input signal because the set-up time is long. Hence, the possibility that a correct signal is transferred to the positive phase output terminal Q of the flip-flop circuit 30 and the external output terminal 37 is high.

Accordingly, this embodiment takes into consideration the fact that the timing fault does not necessarily occur with respect to the change of the input signal, and that a fuzziness exists in the generation of the timing fault. More particularly, this embodiment creates the timing fault patterns as shown in FIGS. 13(H) and 13(I) by assuming that the timing fault always occurs when the input signal changes.

FIG. 14 is a diagram showing timing fault patterns which are created by assuming the timing fault in a first flip-flop circuit 29 of the logic circuit shown in FIG 8. FIG. 15 is a diagram showing timing fault patterns which are created by assuming the timing fault in a second flip-flop circuit 30 of the logic circuit shown in FIG. 8.

FIG. 16 is a diagram showing timing fault patterns which are created by assuming the timing fault in a third flip-flop circuit 31 of the logic circuit shown in FIG 8. FIG. 17 is a diagram showing timing fault patterns which are created by assuming the timing fault in a fourth flip-flop circuit 32 of the logic circuit shown in FIG. 8.

In FIGS. 14 through 17, "X" denotes an undefined logic value output, and "-" denotes a normal output having a defined logic value "1" or "0".

For example, the evaluation value calculating means 15 calculates the evaluation value which is required to specify the element which is assumed to generate the timing fault, according to a first evaluation value calculation method based on the following formula (1). In the formula (1), EV denotes the evaluation value, M denotes a number of fail outputs E in the fail information matching the undefined logic value output "X" in the timing fault pattern, and N denotes a number of observable timing faults at the external output terminals.

$$EV=M/N \qquad (1)$$

The following Table 1 shows the number N of observable timing faults at the external output terminals, the number M of fail outputs E in the fail information matching the undefined logic value output "X" in the timing fault pattern, the evaluation value EV, and an order ORD with respect to the flip-flop circuits 29 through 32. In the Table 1, the flip-flop circuits 29 through 32 are respectively denoted by FF29 through FF32.

TABLE 1

|     | FF29  | FF30  | FF31  | FF32  |
|-----|-------|-------|-------|-------|
| N   | 15    | 7     | 3     | 4     |
| M   | 6     | 3     | 1     | 3     |
| EV  | 0.400 | 0.429 | 0.333 | 0.750 |
| ORD | 3     | 2     | 4     | 1     |

In other words, in the case of the timing fault pattern which is created by assuming the timing fault in the flip-flop circuit 29 as shown in FIG. 14, the number of undefined logic value outputs "X", that is, the number N of observable timing faults at the external output terminals 36 through 39 is 15.

In addition, in the case of the timing fault pattern which is created by assuming the timing fault in the flip-flop circuit 30 as shown in FIG. 15, the number N of observable timing faults at the external output terminals 36 through 39 is 7.

Moreover, in the case of the timing fault pattern which is created by assuming the timing fault in the flip-flop circuit 31 as shown in FIG. 16, the number N of observable timing faults at the external output terminals 36 through 39 is 3.

Furthermore, in the case of the timing fault pattern which is created by assuming the timing fault in the flip-flop circuit 32 as shown in FIG. 17, the number N of observable timing faults at the external output terminals 36 through 39 is 4.

When the fail information shown in FIG. 11 and the timing fault patterns shown in FIG. 14 are compared, the number M of fail outputs E in the fail information shown in FIG. 11 matching the undefined logic value output "X" in the timing fault patterns shown in FIG. 14 is 6.

When the fail information shown in FIG. 11 and the timing fault patterns shown in FIG. 15 are compared, the number M of fail outputs E in the fail information shown in FIG. 11 matching the undefined, logic value output "X" in the timing fault patterns shown in FIG. 15 is 3.

When the fail information shown in FIG. 11 and the timing fault patterns shown in FIG. 16 are compared, the number M of fail outputs E in the fail information shown in FIG. 11 matching the undefined logic value output "X" in the timing fault patterns shown in FIG. 16 is 1.

When the fail information shown in FIG. 11 and the timing fault patterns shown in FIG. 17 are compared, the number M of fail outputs E in the fail information shown in FIG. 11 matching the undefined logic value output "X" in the timing fault patterns shown in FIG. 17 is 3.

Accordingly, the evaluation value of the flip-flop circuit 29 is 6/15=0.400, the evaluation value of the flip-flop circuit 30 is 3/7=0.429, the evaluation value of the flip-flop circuit 31 is 1/3=0.333, and the evaluation value of the flip-flop circuit 32 is 3/4=0.750, as shown in the Table 1. Hence, the order ORD which indicates the probability that the timing fault is generated in the flip-flop circuits 29 through 32 is highest (that is, the value is smallest) for the flip-flop circuit 32 second highest for the flip-flop circuit 30, third highest for the flip-flop circuit 29, and lowest for the flip-flop circuit 31, as shown in the Table 1.

FIG. 18 is a diagram showing other test patterns applied to the logic circuit shown in FIG. 8. In addition, FIGS. 19(A) through 19(I) are time charts for explaining a method of creating timing fault patterns when a set-up timing fault is assumed in a specific flip-flop circuit within the logic circuit shown in FIG. 8 in a case where the test patterns shown in FIG. 18 are used.

In the test patterns shown in FIG. 18, the clear signal CLR1 is CLR1=0 and the clear signal CLR2 is CLR2=0 in the test pattern P0. Otherwise, the test patterns shown in FIG. 18 are the same as the test patterns shown in FIG. 9.

In the test patterns shown in FIG. 18, the clear signals CLR1 and CLR2 in the test pattern P0 are not triggered. Hence, the internal memories of the flip-flop circuits 29 through 33 are not cleared, and the undefined initial values are transferred as they are, thereby causing the external output value OUT2 to become an undefined logic value.

In such a case, it is impossible to judge whether the undefined logic value is caused by the timing fault or the anticipated value is, an undefined logic value. As a result, the accuracy of specifying the element which is assumed to generate the timing fault deteriorates.

Accordingly, in such a case, although the positive phase output terminal Q of the flip-flop circuit 30 also outputs an undefined logic value, it is preferable to carry out the process so as to exclude the signal having the undefined logic value from the timing fault patterns of the external output signals.

In other words, when carrying out the process in this manner, it is possible to specify the timing fault patterns to the patterns which have the possibility of generating the timing fault, and the element which is assumed to generate the timing fault can be specified with a high accuracy.

Figure 20:
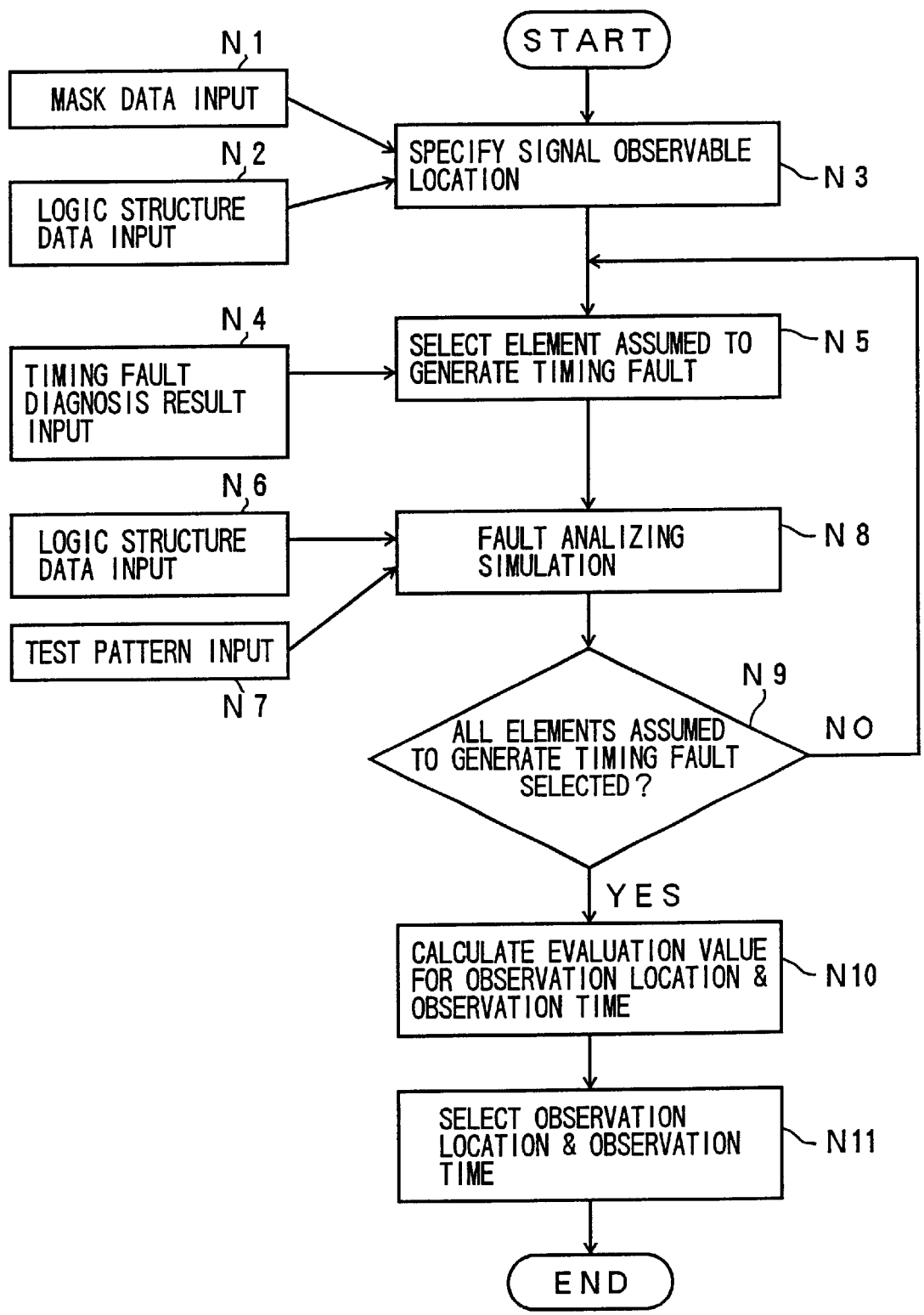
FIG. 20 is a flow chart for explaining the operation of the timing fault observation location/observation time specifying part of the embodiment of the timing fault diagnosis apparatus.

FIG. 20 is a flow chart for explaining the operation of the timing fault observation location/observation time specifying part 12 shown in FIGS. 1 and 3.

First, in the signal observable location specifying means 18, a step N1 shown in FIG. 20 inputs the mask data and a step N2 inputs the logic structure data. Based on these inputs, in the signal observable location specifying means 18, a step N3 specifies the location where the signal is observable on the surface layer of the integrated circuit chip 1.

Next, in the timing fault analyzing simulator 20, a step N4 inputs the timing fault diagnosis result, and a step N5 selects the element which is assumed to generate the timing fault based on this input. Further, a step N6 inputs the logic structure data, and a step N7 inputs the test pattern. A step N8 carries out a fault analysis simulation based on these inputs. In other words, the timing fault is assumed for each element which is assumed to generate the timing fault, and the timing fault observable location and observation time are calculated.

Then, a step N9 decides whether or not all of the elements assumed to generate the timing fault are selected, and the process returns to the step N5 if the decision result in the step N9 is NO. Hence, the steps N5 through N8 are repeated until all of the elements assumed to generate the timing fault are selected.

If the decision result in the step N9 is YES, a step N10 calculates the evaluation value which is required to select the timing fault observation location and observation time, for each calculated timing fault observation location and observation time. Thereafter, a step N11 sorts the calculated evaluation values, and selects the timing fault observation location and observation time based on the sorted result. The process ends after the step N11

Figure 21:
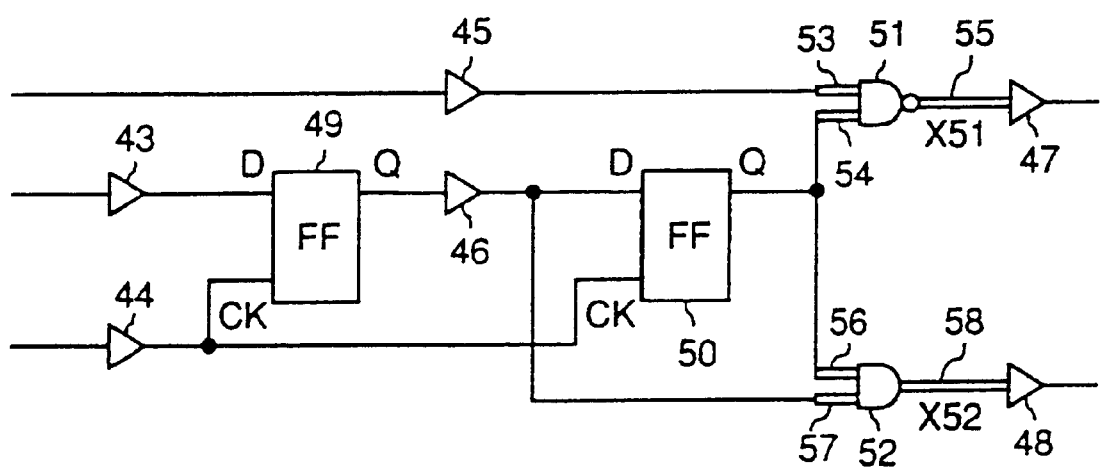
FIG. 21 is a circuit diagram for explaining a method of selecting a timing fault observation location and an observation time in the embodiment of the timing fault diagnosis apparatus.

FIG. 21 is a circuit diagram for explaining a method of selecting the timing fault observation location and observation time in this embodiment of the timing fault diagnosis apparatus. More particularly, FIG. 21 shows a part of the circuit which is to be subjected to the timing fault diagnosis.

The circuit shown in FIG. 21 includes buffer circuits 43 through 48, flip-flop circuits 49 and 50, a NAND circuit 51, and an AND circuit 52 which are connected as shown. Bold lines 53 through 58 indicate signal observable locations on the surface layer of the integrated circuit chip 1.

In this particular case, the positive phase outputs of the flip-flop circuits 49 and 50 are not directly observable. Hence, the following description is given with respect to a case where the timing faults of the flip-flop circuits 49 and 50 are observed from an output X51 of the NAND circuit 51 and an output X52 of the AND circuit 52.

Figures 23, 24:
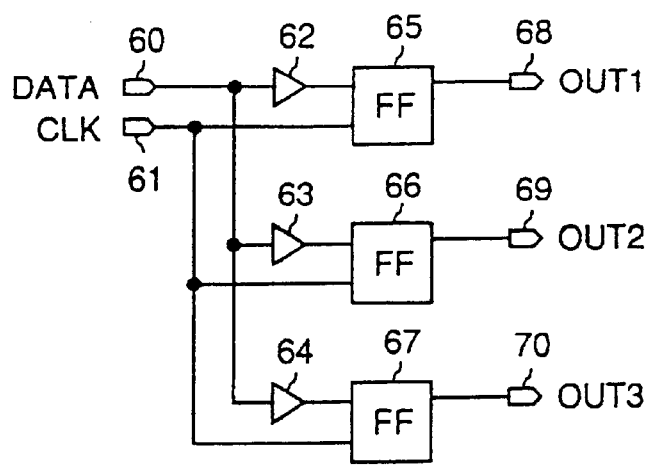
FIG. 23 is a diagram showing a simulation result of the timing fault analysis when the timing fault is assumed in a second flip-flop circuit within the circuit which is to be subjected to the timing fault diagnosis.
FIG. 24 is a circuit diagram showing the circuit which is to be subjected to the timing fault diagnosis for explaining a method of detecting a number of elements which are assumed to have the timing fault by a logical technique which utilizes results obtained by a static timing analyzing tool.

FIG. 22 is a diagram showing a simulation result of the timing fault analysis when the timing fault is assumed in a first flip-flop circuit 49 within the circuit shown in FIG. 21 which is to be subjected to the timing fault diagnosis. In addition, FIG. 23 is a diagram showing a simulation result of the timing fault analysis when the timing fault is assumed in a second flip-flop circuit 50 within the circuit shown in FIG. 21 which is to be subjected to the timing fault diagnosis. In FIGS. 22 and 23, "X" denotes an undefined logic value output (timing fault propagation output), and "-" denotes a normal output having a defined logic value "1" or "0".

In this embodiment, the evaluation value with respect to the flip-flop circuits 49 and 50 at the timing fault observation location and observation time is calculated from the following formula (2) based on the simulation result of the timing fault analysis, where FF denotes a flip-flop circuit, i=49 or 50, and dFFi takes a value "1" if the undefined logic value output "X" exists in the timing fault patterns when the timing fault is assumed in the flip-flip circuit FFi and takes a value "0" if the undefined logic value output "X" does not exist in the timing fault patterns when the timing fault is assumed in the flip-flop circuit FFi.

(Evaluation Value With Respect To $FFi$)=$dFFi/(dFF49+dFF50)$ (2)

In the formula (2), the denominator is the sum total of each of the dFFi with respect to all of the flipt-flop circuits 49 and 50 which are assumed to generate the timing fault. In addition, the evaluation value is set to 0 when the value of the denominator becomes 0.

In a case where the timing fault observation location is the output end 55 of the NAND circuit 51 and the timing fault observation time is the time when the test pattern P1 is applied, the undefined logical value output "X" is only observable in this embodiment when the timing fault is assumed to be generated in the flip-flop circuit 49.

Accordingly, dFF49=1 and dFF50=0 in this case, and the evaluation value with respect to the flip-flop circuit 49 at the timing fault observation location and observation time is 1 in the case where the timing fault observation location is the output end 55 of the NAND circuit 51 and the timing fault observation time is the time when the test pattern P1 is applied.

In a case where the timing fault, observation location is the output end 55 of the NAND circuit 51 and the timing fault observation time is the time when the test pattern P2 is applied, the undefined logical value output "X" is observable in this embodiment when the timing fault is assumed to be generated in the flip-flop circuit 49 and also when the timing fault is assumed to be generated in the flip-flop circuit 50.

Accordingly, dFF49=1 and dFF50=1 in this case, and the evaluation value with respect to the flip-flop circuit 50 at the timing fault observation location and observation time is 0.5 in the case where the timing fault observation location is the output, end 55 of the NAND circuit 51 and the timing fault observation time is the time when the test pattern P2 is applied.

Therefore, when the evaluation values of the timing fault observation location and observation time with respect to the flip-flop circuits 49 and 50 are calculated in the above described manner, the following Tables 2 and 3 are obtained.

TABLE 2

| Observation Location | Output End 55 of NAND Circuit 51 | | | | | | |
|---|---|---|---|---|---|---|---|
| Observation Time | P1 | P2 | P3 | P4 | P5 | P6 | P7 |
| Evaluation Value With Respect to FF49 | 1 | 0.5 | 0 | 0 | 0.5 | 0 | 1 |
| Evaluation Value With Respect to FF50 | 0 | 0.5 | 0 | 0 | 0.5 | 0 | 0 |

TABLE 3

| Observation Location | Output End 58 of AND Circuit 52 | | | | | | |
|---|---|---|---|---|---|---|---|
| Observation Time | P1 | P2 | P3 | P4 | P5 | P6 | P7 |
| Evaluation Value With Respect to FF49 | 0 | 0 | 0 | 0 | 1 | 0 | 0 |
| Evaluation Value With Respect to FF50 | 0 | 1 | 0 | 0 | 0 | 1 | 0 |

In other words, in this particular case, it can be evaluated that the output end 55 of the NAND circuit 51 is a location suited for observing the timing fault of the flip-flop circuit 49 at the times when the test patterns P1 and P7 are applied.

On the other hand, it can be evaluated that the output end 58 of the AND circuit 52 is a location suited for observing the timing fault of the flip-flop circuit 49 at the time when the test pattern P5 is applied, and is avocation suited for observing the timing fault of the flip-flop circuit 50 at the times when the test patterns P2 and P6 are applied.

FIGS. 24 through 27 are diagrams for explaining a method of detecting the number of elements which are assumed to generate the timing fault by a logical technique which utilizes the results obtained by a static timing analyzing tool.

FIG. 24 is a circuit diagram showing the circuit which is to be subjected to the timing fault 35 diagnosis. The circuit shown in FIG. 24 includes external output terminals 60 and 61, buffer circuits 62 through 64, flip-flop circuits 65 through 67, and external output terminals 68 through 70 which are connected as shown. In FIG. 24, DATA denotes data, CLK denotes a clock, and OUT1 through OUT3 denote output data.

Figure 25C:
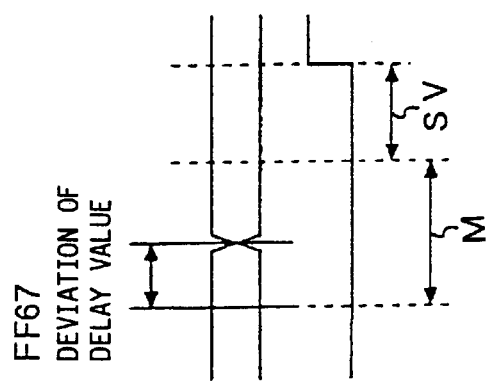
FIGS. 25(A) through 25(C) are time charts for explaining standard values and margins of set-up times of flip-flop circuits within the circuit shown in FIG. 24 which is to be subjected to the timing fault diagnosis.
Figure 25B:
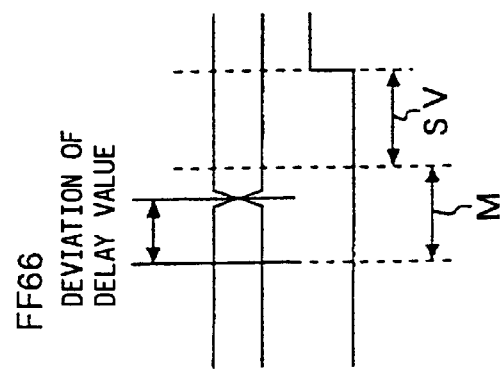
Figure 25A:
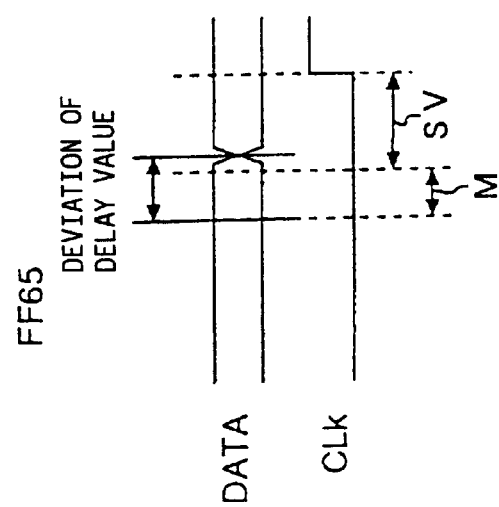

FIGS. 25(A) through 25(C) are time charts for explaining standard values SV and margins M of set-up times of the flip-flop circuits 65, 66 and 67 within the circuit shown in FIG. 24 which is to be subjected to the timing fault diagnosis. The standard value SV refers to a minimum set-up time to ensure correct operation. FIG. 25(A) shows the standard value SV and the margin M with respect to the flip-flop circuit 65. FIG. 25(B) shows the standard value SV and the margin M with respect to the flip-flop circuit 66. In addition, FIG. 25(C) shows the standard value SV and the margin M with respect to the flip-flop circuit 67.

In this particular case, the margin M of the flip-flop circuit 67 is the largest, the margin M of the flip-flop circuit 66 is the second largest, and the margin M of the flip-flop 65 is the smallest. Accordingly, with respect to the test patterns and the anticipated values shown in FIG. 26, it can be predicted that the fail information will become as shown in FIG. 27.

FIG. 26 is a diagram showing the test patterns applied to the circuit shown in FIG. 24 which is to be subjected to the timing fault diagnosis and the anticipated values. In FIG. 26, "1" denotes a logic value "1", "0" denotes a logic value "0", "P" denotes a positive pulse wave, and "X" denotes an undefined logic value output.

FIG. 27 is a diagram showing predicted fail information of the circuit shown in FIG. 24 which is to be subjected to the timing fault diagnosis. In FIG. 27, "E" denotes a fail output, and "-" denotes a normal output having a logic value "1" or "0".

Therefore, it may be regarded that the flip-flop 67 has virtually no possibility of generating the timing fault, and the flip-flop circuit 67 can be excluded from the circuits which are to be subjected to the timing fault diagnosis.

The timing fault analyzing simulator requires a long processing time compared to the static timing analyzing tool. Hence, when using the static timing analyzing tool, it is possible to quickly detect the element which has the possibility of having the timing fault.

Figure 28A:
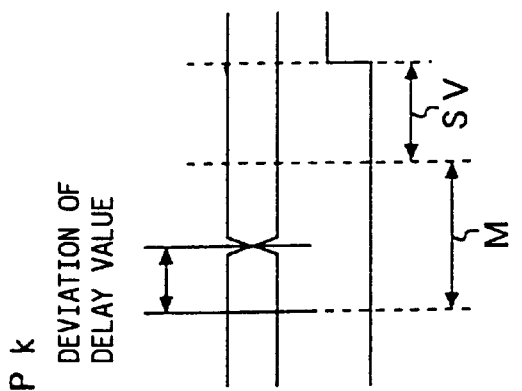
FIGS. 28(A) through 28(C) are time charts for explaining standard values and margins of set-up times for different times (test patterns) of a specific flip-flop circuit within the circuit shown in FIG. 24 which is to be subjected to the timing fault diagnosis.
Figure 28B:
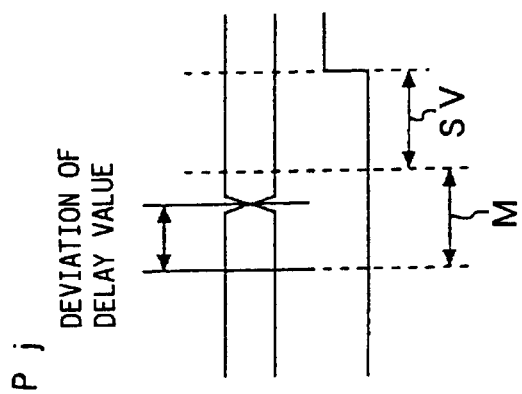
Figure 28C:
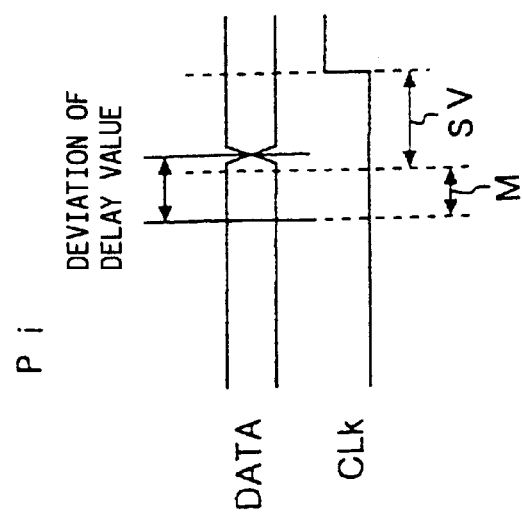

FIGS. 28(A) through 28(C) are time charts for explaining standard values SV and margins M of set-up times for different times (test patterns) of a specific flip-flop circuit 65 within the circuit shown in FIG. 24 which is to be subjected to the timing fault diagnosis. FIG. 28(A) shows the standard value SV and the margin M with respect to a test pattern Pi, FIG. 28(B) shows the standard value SV and the margin M with respect to a test pattern Pj, and FIG. 28(C) shows the standard value SV and the margin M with respect to a test pattern Pk.

In this particular case, the margin M is the smallest with respect to the test pattern Pi, the margin M is the second smallest with respect to the test pattern Pj, and the margin M is the largest with respect to the test pattern Pk. Accordingly, it can be predicted that the possibility of the timing fault is largest in te case of the test pattern Pi, second largest in the case of the test pattern Pj, and smallest in the case of the test pattern Pk.

Therefore, it may be regarded that there is virtually no possibility of the timing fault being generated in the case of the test pattern Pk, and it is unnecessary to assume the timing fault for the test pattern Pk.

By not assuming the timing fault with respect to the test pattern Pk, it is possible to concentrate on the test patterns which are more likely to generate the timing fault. As a result, it is possible to accurately specify the element which is assumed to generate the timing fault.

Figure 29:
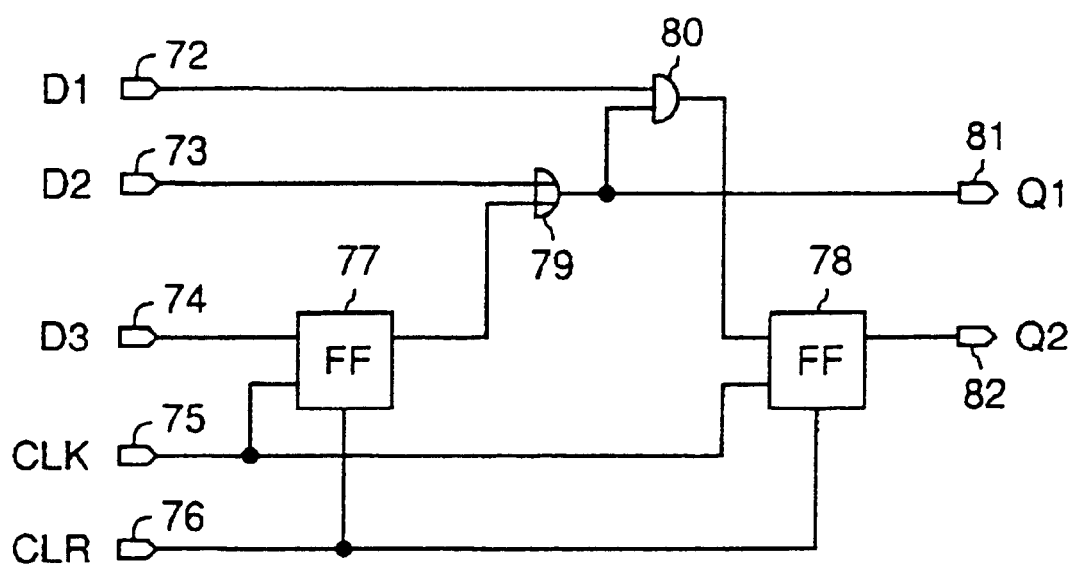
FIG. 29 is a circuit diagram showing the circuit which is to be subjected to the timing fault diagnosis for explaining a second evaluation value calculation method employed by an evaluation value calculating means which forms the timing fault diagnosis part of the embodiment of the timing fault diagnosis apparatus.
Figure 31:
FIG. 31 is a diagram showing timing fault patterns of the circuit shown in FIG. 29 which is to be subjected to the timing fault diagnosis.

FIGS. 29 through 31 are diagrams for explaining for explaining a second evaluation value calculation method employed by the evaluation value calculating means 15 of the timing fault diagnosis part 9.

FIG. 29 is a circuit diagram showing the circuit which is to be subjected to the timing fault diagnosis. The circuit shown in FIG. 29 includes external input terminals 72 through 76, flip-flop circuits 77 and 78, an OR circuit 79, an AND circuit 80, and external output terminals 81 and 82 which are connected as shown. In FIG. 29, D1 through D3 denote input data, CLK denotes a clock, CLR denotes a clear signal, and Q1 and Q2 denote output data.

FIG. 30 is a diagram showing test patterns applied to the circuit shown in FIG. 29 which is to be subjected to the timing fault diagnosis, anticipated values and fail information. In addition, FIG. 31 is a diagram showing timing fault patterns of the circuit shown in FIG. 29 which is to be subjected to the timing fault diagnosis.

As may be seen from FIG. 31, the undefined logic value output "X" occurs with respect to the test pattern P3 when the timing fault is assumed in the flip-flop circuit 77 or 78, and thus, it may be judged that the possibility of the timing fault being generated in the flip-flop circuit 77 is approximately the same as the possibility of the timing fault being generated in the flip-flop circuit 78.

However, with respect to the test patterns P2, P4 and P9, the undefined logic value output "X" occurs only when the timing fault is assumed in the flip-flop circuit 77, and the possibility of the timing fault being generated in the flip-flop circuit 77 is high.

In addition, with respect to the test patterns P5 an P7, the undefined logic value output "X" occurs only when the timing fault is assumed in the flip-flop circuit 78, and the possibility of the timing fault being generated in the flip-flop circuit 78 is high.

Therefore, by taking to consideration the above described possibilities, the second evaluation value calculation method calculates, by the evaluation value calculating means 15, the evaluation value which is required to specify the element assumed to generate the timing fault with respect to the flip-flop circuits 77 and 78, based on the following formula (3), where EV denotes the evaluation value, and i denotes a multiplicity for the case where the timing fault is assumed.

$$EV = \left[\sum_{i=1}^{k} a_i (E_i / T_i)\right] \sum_{i=1}^{k} a_i \tag{3}$$

In the formula (3) referred above, the multiplicity i takes a value "1" only when the timing fault is assumed in one of the flip-flop circuits 77 and 78 and the undefined logic value output "X" occurs in the timing fault pattern. On the other hand, the multiplicity i takes a value "2" when the timing fault is assumed in the flip-flop circuit 77 or the flip-flop circuit 78 and the undefined logic value output "X" occurs in the timing fault pattern.

Furthermore, in the formula (3), $T_i$ denotes the number of undefined logic value outputs "X", $E_i$ denotes the number of undefined logic value outputs "X" matching the fail outputs E, and $a_i$ denotes a weighting coefficient. The denominator of the formula (3) normalizes a maximum value of the evaluation value EV to 1. In this particular case, it is assumed for the sake of convenience that $a_i=1/i$.

The following Table 4 shows the numbers T1, E1, T2 and E2 and the evaluation value EV with respect to the flip-flop circuits 77 and 78, where FF77 indicates the flip-flop circuit 77 and FF78 indicates the flip-flop circuit 78.

TABLE 4

| Values | FF77 | FF78 |
|---|---|---|
| T1, E1 | 3, 1 | 2, 0 |
| T2, E2 | 1, 1 | 1, 1 |
| EV | 0.556 | 0.333 |

Therefore, in this particular case, T1=3 because the undefined logic value output "X" occurs with respect to the test patterns P2, P4 and P9 only when the timing fault is assumed in the flip-flop circuit 77.

In addition, E1=1 because the undefined logic value output "X" which is output only when the timing fault is assumed in the flip-flop circuit 77 matches the fail output E once, that is, only with respect to the test pattern P2.

Moreover, T2=1 because the undefined logic value output "X" is output only with respect to the test pattern P3 regardless of whether the timing fault is assumed in the flip-flop circuit 77 or 78.

Furthermore, E2=1 because the undefined logic value output "X" which is output when the timing fault is assumed in the flip-flop circuit 77 matches the fail output E only with respect to the test pattern P3.

Since $a_1=1$ and $a_2=1/2$ in this case, the evaluation value EV of the flip-flop circuit 77 as the element assumed to generate the timing fault is 0.556 by making the following calculation (4).

$$[a_1(E_1/T_1)+a_2(E_2/T_2)]/(a_1+a_2)=[(1/3)+1/2(1/1)]/[1+(1/2)]=0.556 \quad (4)$$

Further, because the undefined logic value output "X" occurs with respect to the test patterns P5 and P7 only when the timing fault is assumed in the flip-flop circuit 78, T1=2.

In addition, E1=0 because the undefined logic value output "X" which is output only when the timing fault is assumed in the flip-flop circuit 78 does not match the fail output E, that is, does not match with respect to any test pattern.

Moreover, T2=1 because the undefined logic value output "X" is output only with respect to the test pattern P1 regardless of whether the timing fault is assumed in the flip-flop circuit 77 or 78.

Furthermore, E2=1 because the undefined logic value output "X" which is output when the timing fault is assumed in the flip-flop circuit 77 matches the fail output E only with respect to the test pattern P3.

Since $a_1=1$ and $a_2=1/2$ in this case, the evaluation value EV of the flip-flop circuit 78 as the element assumed to generate the timing fault is 0.333 by making the following calculation (5).

$$[a_1(E_1/T_1)+a_2(E_2/T_2)]/(a_1+a_2)=[(0/2)+1/2(1/1)]/[1+(1/2)]=0.333 \quad (5)$$

On the other hand, the evaluation values calculated according to the first evaluation value calculation method become as shown in the following Table 5. The Table 5 shows the number N of observable timing faults at the external output terminals 81 and 82, the number M of fail outputs E in the fail information matching the undefined logic value output "X" in the timing fault pattern, and the evaluation value EV, with respect to the flip-flop circuits 77 and 78. In the Table 5, the flip-flop circuits 77 and 78 are respectively denoted by FF77 through FF78.

TABLE 5

|  | FF77 | FF78 |
|---|---|---|
| N | 4 | 3 |
| M | 2 | 1 |
| EV | 0.500 | 0.333 |

If the timing fault is assumed in the flip-flop circuit 77, the number N of observable timing faults at the external output terminals 81 and 82 is 4.

If the timing fault is assumed in the flip-flop circuit 78, the number N of observable timing faults at the external output terminals 81 and 82 is 3.

When the fail information and the timing fault pattern for the case where the timing fault is assumed in the flip-flop circuit 77 are compared, the number M of fail outputs E in the fail information matching the undefined logic value output "X" in the timing fault pattern is 2.

On the other hand, when the fail information and the timing fault pattern for the case where the timing fault is assumed in the flip-flop circuit 78 are compared, the number M of fail outputs E in the fail information matching the undefined logic value output "X" in the timing fault pattern is 1.

Therefore, when the evaluation values EV required to specify the elements assumed to generate the timing fault are calculated based on the formula (1) with respect to the flip-flop circuits 77 and 78, the evaluation value with respect to the flip-flop circuit 77 is calculated as EV=2/4=0.500, and the evaluation value with respect to the flip-flop circuit 78 is calculated as EV=1/3=0.333.

According to the second evaluation value calculation method, the calculated evaluation value EV becomes larger with respect to those elements which have a high possibility of generating the timing fault.

In the embodiment of the timing fault, diagnosis apparatus and the embodiment of the timing fault diagnosis method according to the present invention described above, the timing fault is diagnosed by comparing the fail information and the timing fault patterns, so as to specify the elements assumed to generate the timing fault. For this reason, it is possible to narrow down the specific locations where the timing faults are to be observed. Consequently, it is possible to confirm the element assumed to generate the timing fault at a high speed, thereby making it possible to make the timing fault diagnosis at a high speed.

In addition, the circuit which is to be subjected to the timing fault diagnosis is extracted from the logic circuit formed in the integrated circuit chip 1 by the following processes, namely, a process of including, in the circuit which is to be subjected to the timing fault diagnosis, the external output terminal to which the timing fault propagates, a process of including, in the circuit which is to be subjected to the timing fault diagnosis, the circuit located on the upstream side along the signal path when viewed from the external output terminal to which the timing fault propagates, and a process of including, in the circuit which is to be subjected to the timing fault diagnosis, the circuit located on the downstream side along the signal path when viewed from the external input terminal within the circuit on the upstream side of the signal path when viewed from the external output terminal to which the timing fault propagates. As a result, it is possible to efficiently determine the circuit which is to be subjected to the timing fault diagnosis. Hence, it is possible to confirm the element assumed to generate the timing fault at a high speed, and to make the timing fault diagnosis at a high speed, also from this point of view.

Moreover, the timing fault patterns for each element having the possibility of generating the timing fault is created by assuming that the timing fault always occurs when the input data applied to the element having the possibility of generating the timing fault undergoes a transition. For this reason, it is possible to accurately specify the element assumed to generate the timing fault. Thus, it is possible to confirm the element assumed to generate the timing fault at a high speed, and to make the timing fault diagnosis at a high speed, also from this point of view.

The evaluation value can be calculated in the evaluation value calculating means 15 of the timing fault diagnosis part 9 according to the first evaluation value calculation method or the second evaluation value calculation method.

According to the first evaluation value calculation method, the evaluation value used to specify the element assumed to generate the timing fault is calculated by dividing, the number of fail outputs included in the fail information matching the timing fault propagation output included in the timing fault patterns corresponding to the element assumed to generate the timing fault, by the number of timing fault propagation outputs included in the timing fault patterns corresponding to the element assumed to generate the timing fault. As a result, it is possible to accurately specify the element assumed to generate the timing fault. Therefore, it is possible to confirm the element assumed to generate the timing fault at a high speed, and to make the timing fault diagnosis at a high speed, also from this point of view.

On the other hand, according to the second evaluation value calculation method, a first value is calculated by dividing, the number of fail outputs included in the fail information matching the timing fault propagation output included in the timing fault patterns corresponding to the element assumed to generate the timing fault, by the number of timing fault propagation outputs included only in the timing fault patterns corresponding to the element assumed to generate the timing fault. A second value is calculated by dividing, the number of fail outputs included in the fail information matching the timing fault propagation output included in the timing fault patterns corresponding to the element assumed to generate the timing fault and the timing fault patterns other than the timing fault patterns corresponding to the element assumed to generate the timing fault, by the number of timing fault propagation outputs included in the timing fault patterns corresponding to the element assumed to generate the timing fault and the timing fault patterns other than the timing fault patterns corresponding to the element assumed to generate the timing fault. The evaluation value used to specify the element assumed to generate the timing fault is calculated by weighting the first value more than the second value and adding the weighted first and second values. Hence, the element assumed to generate the timing fault can be specified even more accurately compared to the case where the first evaluation value calculation method is used to calculate the evaluation value.

Furthermore, the timings of the element having the possibility of generating the timing fault within the circuit which is to be subjected to the timing fault diagnosis, such as the standard value and margin with respect to the set-up time, are measured in advance, so as to narrow down the elements having the possibility of generating the timing fault. For this reason, it is possible to reduce the time required to create the timing fault patterns. Hence, it is possible to confirm the element assumed to generate the timing fault at a high speed, and to make the timing fault diagnosis at a high speed, also from this point of view.

The location where the timing fault is observed is specified to a predetermined position on the surface layer of the integrated circuit chip 1, and the observation time is specified, based on the test pattern, the logic structure data, the timing fault diagnosis result and the mask data. Accordingly, it is possible to observe the timing fault at the surface layer of the integrated circuit chip 1, without the need to form a hole in the integrated circuit chip 1 to observe signals in the underlayers located under the surface layer, and without the need to make the observation at times other than the specified observation time. Therefore, it is possible to confirm the element assumed to generate the timing fault at a high speed, and to make the timing fault diagnosis at a high speed, also from this point of view. In addition, it is possible to reduce the cost of the timing fault diagnosis, and to reduce the cost involved in designing the integrated circuit.

On the other hand, the timing fault observation location and observation time can be specified by the following processes, namely, a process of extracting a location where the signal is observable from the surface layer of the integrated circuit chip 1 based on the mask data, a process of selecting the element assumed to generate the timing fault based on the timing fault diagnosis result, and a process of carrying out a timing fault analyzing simulation based on the test pattern and the logic structure data to calculate the evaluation value which is used to select the timing fault observation location and observation time of the element assumed to generate the timing fault from the signal observable location of the surface layer of the integrated circuit chip 1. For this reason, it is possible to efficiently determine the timing fault observation location and observation time. Consequently, it is possible to confirm the element assumed to generate the timing fault at a high speed, and to make the timing fault diagnosis at a high speed, also from this point of view.

It is possible to carry out a process of re-extracting the circuit which is to be subjected to the timing fault diagnosis, based on the logic structure data, the fail information and the observation result of the timing fault of the integrated circuit chip 1, a process of re-creating the timing fault patterns assuming the timing fault for each element having the possibility of generating the timing fault within the circuit which is to be subjected to the timing fault diagnosis, and a process of re-specifying the element assumed to generate the timing fault by comparing the timing fault patterns and the fail information to diagnose the timing fault. In this case, it is possible to narrow down again the timing fault observation location, so as to more efficiently confirm the element having the timing fault. Accordingly, it is possible to confirm the element assumed to generate the timing fault at a high speed, and to make the timing fault diagnosis at a high speed also from this point of view.

Further, the present invention is not limited to these embodiments, but various variations and modifications may be made without departing from the scope of the present invention.

What is claimed is:

1. A timing fault diagnostic method for diagnosing a timing fault of an integrated circuit chip having a logic circuit formed therein, comprising:

obtaining fail information by applying a test pattern to an external input terminal of the integrated circuit chip;

extracting, from the logic circuit, a circuit which is to be subjected to a timing fault diagnosis, based on logic structure data of the logic circuit and the fail information;

creating a timing fault pattern by assuming a timing fault in each element of the circuit having a possibility of generating a timing fault within the circuit which is to be subjected to the timing fault diagnosis; and specifying an element which is assumed to generate the timing fault based on a timing fault diagnosis by comparing the timing fault pattern and the fail information.

2. The timing fault diagnostic method as claimed in claim 1, wherein said extracting comprises:

having in said circuit which is to be subjected to the timing fault diagnosis an external output terminal to which a timing fault propagates;

having in said circuit which is to be subjected to the timing fault diagnosis a circuit on an upstream side along a signal path when viewed from the external output terminal to which the timing fault propagates; and having in said circuit which is to be subjected to the timing fault diagnosis a circuit on a downstream side of a signal path when viewed from an external input terminal within the circuit on the upstream side when viewed from the external output terminal to which the timing fault propagates.

3. The timing fault diagnostic method as claimed in claim 1, wherein said creating creates the timing fault pattern by always assuming that the timing fault occurs when input data applied to the element assumed to generate the timing fault undergoes a transition.

4. The timing fault diagnostic method as claimed in claim 1, wherein said creating measures in advance a standard value and a margin with respect to a timing operation for each test pattern, and creates the timing fault pattern by assuming that the timing fault occurs only with respect to a specific test pattern of the element assumed to generate the timing fault, the standard value being a minimum set-up time for ensuring a correct operation.

5. The timing fault diagnostic method as claimed in claim 1, wherein said creating creates the timing fault pattern by excluding a timing fault propagation output from the timing fault pattern when an anticipated value of an output pattern has an undefined logic value.

6. The timing fault diagnostic method as claimed in claim 1, wherein said specifying calculates an evaluation value which is used to specify the element assumed to generate the timing fault by dividing a number of fail outputs of the fail information, matching a timing fault propagation output of the timing fault pattern corresponding to the element assumed to generate the timing fault, by a number of timing fault propagation outputs of the timing fault pattern corresponding to the element assumed to generate the timing fault.

7. The timing fault diagnostic method as claimed in claim 1, wherein said specifying calculates an evaluation value which is used to specify the element assumed to generate the timing fault by:

calculating a first value by dividing a number of fail outputs of the fail information, matching a timing fault propagation output of the timing fault pattern corresponding to the element assumed to generate the timing fault, by a number of timing fault propagation outputs of only the timing fault pattern corresponding to the element assumed to generate the timing fault;

calculating a second value by dividing the number of fail outputs of the fail information, matching the timing fault propagation output of the timing fault pattern corresponding to the element assumed to generate the timing fault and a timing fault pattern other than the timing fault pattern corresponding to the element assumed to generate the timing fault, by a number of timing fault propagation outputs of the timing fault pattern corresponding to the element assumed to generate the timing fault and the timing fault pattern other than the timing fault pattern corresponding to the element assumed to generate the timing fault; and weighting the first value more than the second value and adding the weighted first and second values to obtain the evaluation value.

8. The timing fault diagnostic method as claimed in claim 1, further comprising:

measuring in advance a standard value and a margin with respect to a timing operation for each of the elements having the possibility of generating the timing fault within the circuit which is to be subjected to the timing fault diagnosis, and narrowing down the element which has the possibility of generating the timing fault, the standard value being a minimum set-up time for ensuring a correct operation.

9. The timing fault diagnostic method as claimed in claim 1, further comprising:

specifying a timing fault observation location to a predetermined location on a surface layer of the integrated circuit chip and specifying a timing fault observation time, based on the test pattern, the logic structure data, a result of the timing fault diagnosis, and mask data.

10. The timing fault diagnostic method as claimed in claim 9, wherein said specifying further comprises:

extracting a signal observable location from the surface layer of the integrated circuit chip based on the mask data;

selecting the element assumed to generate the timing fault based on the result of the timing fault diagnosis; and carrying out a timing fault analyzing simulation based on the test pattern and the logic structure data, and calculating an evaluation value used to select the timing fault observation location and the timing fault observation time of the element assumed to generate the timing fault from the signal observable location on the surface layer of the integrated circuit chip.

11. The timing fault diagnostic method as claimed in claim 1, further comprising:

re-extracting the circuit which is to be subjected to the timing fault diagnosis based on the logic structure data, the fail information and an observation result of the timing fault of the integrated circuit chip;

re-creating the timing fault pattern assuming the timing fault for each of the elements having the possibility of generating the timing fault within the circuit which is to be subjected to the timing fault diagnosis; and re-specifying the element assumed to generate the timing fault by comparing the timing fault pattern and the fail information to diagnose the timing fault.

12. A timing fault apparatus for diagnosing a timing fault of an integrated circuit chip having a logic circuit formed therein, comprising:

a timing fault diagnosis part diagnosing a timing fault based on a test pattern, logic structure data of the logic circuit and fail information, and specifying an element assumed to generate a timing fault; and a timing fault observation location/observation time specifying part specifying a timing fault observation location to a predetermined location on a surface layer of the integrated circuit chip and specifying a timing fault observation time, based on the test pattern, the logic structure data, a result of a timing fault diagnosis, and mask data of the logic circuit.

13. The timing fault diagnosis apparatus as claimed in claim 12, wherein said timing fault observation location/observation time specifying part comprises:

signal observable location extracting means for extracting a signal observable location from the surface layer of the integrated circuit chip, based on the mask data; and a timing fault analyzing simulator carrying out a timing fault analyzing simulation based on the test pattern and the logic structure data, and selecting the timing fault observation location and the timing fault observation time of the element assumed to generate the timing fault from the signal observable location on the surface layer of the integrated circuit chip.

14. The timing fault diagnosis apparatus as claimed in claim 13, wherein said timing fault diagnosis part comprises:

means for inputting an observation result obtained by observing a timing fault of the integrated circuit chip, and re-specifying an element assumed to generate the timing fault.

15. The timing fault diagnosis apparatus as claimed in claim 13, wherein said timing fault diagnosis part comprises:

an input unit inputting an observation result obtained by observing a timing fault of the integrated circuit chip, and re-specifying an element assumed to generate the timing fault.

16. The timing fault diagnosis apparatus as claimed in claim 12, wherein said timing fault observation location/observation time specifying part comprises:

a signal observable location extracting unit extracting a signal observable location from the surface layer of the integrated circuit chip, based on the mask data; and a timing fault analyzing simulator carrying out a timing fault analyzing simulation based on the test pattern and the logic structure data, and selecting the timing fault observation location and the timing fault observation time of the element assumed to generate the timing fault from the signal observable location on the surface layer of the integrated circuit chip.

17. A timing fault apparatus for diagnosing a timing fault of an integrated circuit chip having a logic circuit formed therein, comprising:

a timing fault diagnosis part diagnosing a timing fault based on a test pattern, logic structure data of the logic circuit and fail information, and specifying an element assumed to generate a timing fault, said timing fault diagnosis part comprising:

timing fault pattern creating means for extracting a circuit which is to be subjected to the timing fault diagnosis from the logic circuit, based on the test pattern, the logic structure data and the fail information, and creating a timing fault pattern assuming a timing fault for each of the elements having a possibility of generating a timing fault within said circuit which is to be subjected to the timing fault diagnosis;

evaluation value calculating means for comparing the fail information and the timing fault pattern, and calculating an evaluation value used to specify the element assumed to generate the timing fault; and timing fault diagnosis means for diagnosing a timing fault based on the evaluation value, and specifying the element assumed to generate the timing fault.

18. A timing fault apparatus for diagnosing a timing fault of an integrated circuit chip having a logic circuit formed therein, comprising:

a timing fault diagnosis part diagnosing a timing fault based on a test pattern, logic structure data of the logic circuit and fail information, and specifying an element assumed to generate a timing fault, said timing fault diagnosis part comprising:

a timing fault pattern creating unit extracting a circuit which is to be subjected to the timing fault diagnosis from the logic circuit, based on the test pattern, the logic structure data and the fail information, and creating a timing fault pattern assuming a timing fault for each of the elements having a possibility of generating a timing fault within said circuit which is to be subjected to the timing fault diagnosis;

an evaluation value calculating unit comparing the fail information and the timing fault pattern, and calculating an evaluation value used to specify the element assumed to generate the timing fault; and a timing fault diagnosis unit diagnosing a timing fault based on the evaluation value, and specifying the element assumed to generate the timing fault.

* * * * *